United States Patent
Lee et al.

(10) Patent No.: US 9,990,964 B1
(45) Date of Patent: Jun. 5, 2018

(54) STORAGE DEVICE OPERATING DIFFERENTLY ACCORDING TO TEMPERATURE OF MEMORY

(71) Applicant: SAMSUNG ELECTRONICS CO., LTD., Suwon-Si, Gyeonggi-do (KR)

(72) Inventors: Sangsu Lee, Seoul (KR); Yusuf Cinar, Yongin-si (KR); Nam-Hoon Kim, Suwon-Si (KR); Heeyoub Kang, Seoul (KR); Young-Rok Oh, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/626,574

(22) Filed: Jun. 19, 2017

(30) Foreign Application Priority Data

Dec. 5, 2016 (KR) .......................... 10-2016-0164550

(51) Int. Cl.
| | | |
|---|---|---|
| G11C 7/04 | (2006.01) | |
| G11C 11/406 | (2006.01) | |
| G11C 13/00 | (2006.01) | |
| G11C 16/10 | (2006.01) | |
| G11C 16/34 | (2006.01) | |
| G11C 11/16 | (2006.01) | |

(52) U.S. Cl.
CPC ............ *G11C 7/04* (2013.01); *G11C 11/1673* (2013.01); *G11C 11/1695* (2013.01); *G11C 11/40626* (2013.01); *G11C 13/0069* (2013.01); *G11C 16/10* (2013.01); *G11C 16/34* (2013.01); *G11C 16/3418* (2013.01)

(58) Field of Classification Search
CPC ... G11C 7/04; G11C 11/1673; G11C 11/1695; G11C 11/40626; G11C 13/0069; G11C 16/10; G11C 16/34; G11C 16/3418
USPC .... 365/211, 185.02, 185.09, 185.23, 185.24, 365/185.28
See application file for complete search history.

(56) References Cited

U.S. PATENT DOCUMENTS

| | | | |
|---|---|---|---|
| 7,305,148 | B2 | 12/2007 | Spampinato et al. |
| 8,548,639 | B2 | 10/2013 | Lim et al. |
| 8,667,215 | B2 | 3/2014 | Marotta et al. |
| 8,873,323 | B2 | 10/2014 | Li |
| 8,995,184 | B2 | 3/2015 | Takafuji et al. |
| 9,152,568 | B1 | 10/2015 | Seigler |

(Continued)

OTHER PUBLICATIONS

Venkat et al., "Understanding MSP430 Flash Data Retention", Texas Instruments, SLAA392, Mar. 2008, pp. 1-12.

(Continued)

*Primary Examiner* — Tan T. Nguyen
(74) *Attorney, Agent, or Firm* — F. Chau & Associates, LLC

(57) ABSTRACT

A storage device includes memories and a controller. The controller controls first and second program operations on the memory. When a temperature of the memory is lower than a reference value, the controller controls execution of the first program operation. When the temperature of the memory is equal to or higher than the reference value, the controller controls execution of the second program operation which consumes a smaller amount of power than the first program operation. The controller adjusts an operational condition of the memory such that bandwidth on the memory remains equivalent during the first and second program operations.

20 Claims, 17 Drawing Sheets

(56) References Cited

U.S. PATENT DOCUMENTS

| | | |
|---|---|---|
| 2002/0156792 A1 | 10/2002 | Gombocz et al. |
| 2003/0064393 A1 | 4/2003 | Bass et al. |
| 2012/0173827 A1 | 7/2012 | Wood et al. |
| 2012/0224425 A1 | 9/2012 | Fai et al. |
| 2012/0287711 A1* | 11/2012 | Kim ................... G11C 11/5642 |
| | | 365/185.03 |
| 2012/0327829 A1 | 12/2012 | Sinha |
| 2013/0275665 A1 | 10/2013 | Saraswat et al. |
| 2014/0101371 A1 | 4/2014 | Nguyen et al. |
| 2014/0149638 A1 | 5/2014 | Jain et al. |
| 2014/0233132 A1 | 8/2014 | Budiman et al. |
| 2014/0281311 A1 | 9/2014 | Walker et al. |
| 2014/0359242 A1* | 12/2014 | Son ..................... G06F 13/1689 |
| | | 711/167 |
| 2015/0092488 A1 | 4/2015 | Wakchaure et al. |
| 2015/0301932 A1* | 10/2015 | Oh ......................... G06F 11/00 |
| | | 711/102 |
| 2016/0118111 A1 | 4/2016 | Hyun et al. |
| 2016/0139812 A1 | 5/2016 | Zhang |
| 2016/0162219 A1 | 6/2016 | Erez |
| 2016/0172051 A1 | 6/2016 | Liang et al. |

OTHER PUBLICATIONS

Meza et al., "A Large-Scale Study of Flash Memory Failures in the Field", ACM Sigmetrics, Jun. 2015, vol. 43 Issue 1, Jun. 2015, pp. 177-190.

Hetzler, "Measuring Reliability in SSD Storage Systems", Flash Memory Summit 2014, pp. 1-39.

* cited by examiner

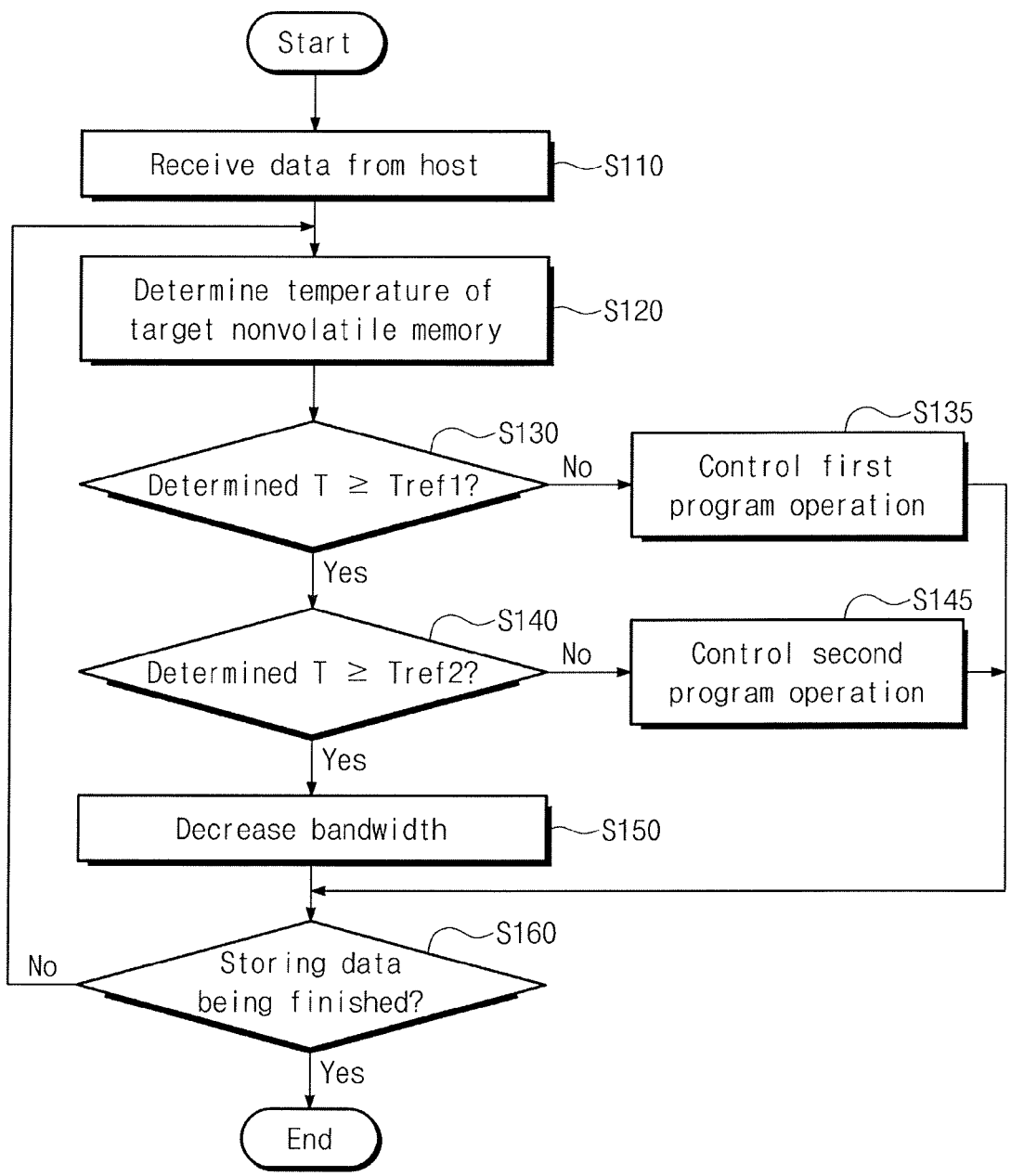

FIG. 8
INF
| Data | Address | Program Manner |
|------|---------|----------------|
| DAT1 | 0x300000 - 0x9FFFFF | First (TLC) |
| DAT2 | 0xF00000 - 0xFFFFFF | First (TLC) |
|      | 0xA00000 - 0xA09999 | Second (SLC) |
| DAT3 | 0x000000 - 0x2CFFFF | Second (SLC) |
FIG. 9
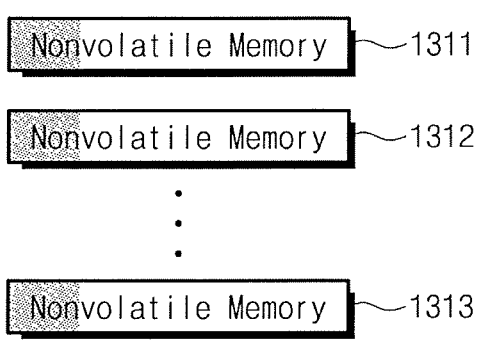
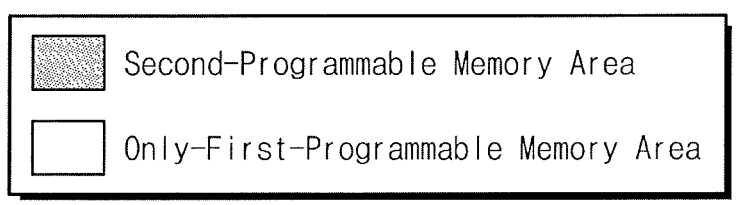

STORAGE DEVICE OPERATING DIFFERENTLY ACCORDING TO TEMPERATURE OF MEMORY

CROSS-REFERENCE TO RELATED APPLICATION

This U.S. non-provisional patent application claims priority under 35 U.S.C. § 119 from Korean Patent Application No. 10-2016-0164550, filed on Dec. 5, 2016, the entire contents of which are incorporated by reference herein.

TECHNICAL FIELD

The inventive concept relates to electronic devices, and more particularly, relates to configurations and operations of a storage device that may store and output data.

DISCUSSION OF THE RELATED ART

Various types of electronic devices are being used these days. An electronic device may include various electronic circuits, many of which are integrated circuits. The electronic device may perform its own function(s) and provide a service to a user, according to operations of the electronic circuits included in the electronic device.

A storage device is an example of an electronic device. The storage device may include a memory element. The storage device may store data in the memory element, or may output data stored in the memory element. Thus, the storage device may provide a storage service to a user.

As technologies such as electronic circuit design and a semiconductor fabrication continue to develop, a storage device including a semiconductor memory element is being widely used. The storage device including the semiconductor memory element may operate at high speed and may be resistant to damage from physical impact. However, the storage device including the semiconductor memory element still requires considerations of various factors such as lifespan, data reliability, power consumption, and the like.

For example, when temperature of a memory element of a storage device increases, the storage device may operate with relatively large power consumption and operational performance of the storage device may be degraded. In a worst case, when the temperature of the memory element of the storage device excessively increases, the memory element may be damaged and an error may occur in data stored in the storage device, and the data may be lost. Moreover, damage to the memory element may cause a reduction in the lifespan of the storage device.

SUMMARY

Example embodiments of the inventive concept may provide a storage device which may operate differently according to the temperature of a memory. The storage device, for example, according to the example embodiments of inventive concept may control different operational schemes according to the temperature of the memory such that the temperature of the memory does not excessively increase.

According to an example embodiment of the inventive concept, a storage device may include a nonvolatile memory; and a memory controller configured to control a first program operation on the nonvolatile memory when a temperature of the nonvolatile memory is less than a first reference value and control a second program operation on the nonvolatile memory when the temperature of the nonvolatile memory is equal to or greater than the first reference value, in which the first program operation and the second program operation are performed on data stored in the nonvolatile memory. The second program operation consumes less power than the first program operation, and wherein the memory controller is further configured to adjust an operational condition of the nonvolatile memory, such that bandwidth on the nonvolatile memory remains equivalent during the first and second program operations.

The example embodiments of the inventive concept may provide a storage device including a memory and a controller. The controller may control first and second program operations on the memory such that data is stored in the memory. When temperature of the memory is lower than a reference value, the controller may control execution of the first program operation. When the temperature of the memory is equal to or higher than the reference value, the controller may control execution of the second program operation. The second program operation may consume a smaller amount of power than the first program operation.

In some example embodiments of the inventive concept, the second program operation may include a smaller number of voltage applying operations than the first program operation. For example, memory cells of the memory may include multi-level cells or triple-level cells. In such an example, the first program operation may include a multi-level cell program operation or a triple-level cell program operation, and the second program operation may include a single-level cell program operation. The controller may adjust an operational condition of the memory such that bandwidth on the memory remains equivalent during the first and second program operations.

In some example embodiments of the inventive concept, the memory may include a plurality of memories, and the controller may transmit first data and second data to at least some of the plurality of memories. For example, when the temperature of a first memory among the plurality of memories is equal to or higher than a reference value, and the temperature of each of second and third memories among the plurality of memories is lower than the reference value, the controller may transmit (or re-transmit) the first data which is directed to the first memory to the second memory according to the second program operation, and may transmit (or re-transmit) the second data, which is directed to the second memory, to the third memory according to the first program operation. The controller may perform the second program operation of transmitting the first data to the second memory together with the first program operation of transmitting the second data to the third memory concurrently.

In an embodiment of the inventive concept, a storage device includes a plurality of nonvolatile memories; a memory controller configured to receive instructions from a host, and to control read and write operations on data stored in the nonvolatile memories, and control at least a first program operation and a second program operation; and at least one temperature sensor being arranged substantially adjacent at least one nonvolatile memory of the plurality of nonvolatile memories, the at least one temperature sensor having an output connected to the memory controller to provide temperature information to the memory controller. The memory controller may determine a temperature of the at least one nonvolatile memory, and control execution of the first program operation when the determined temperature of the at least one nonvolatile memory is less than a first reference value. The memory controller controls execution of the second program operation when the determined temperature of the at least one nonvolatile memory is equal to or greater than the first reference value.

The memory controller may decrease a bandwidth of the at least one nonvolatile memory when the determined temperature of the at least one nonvolatile memory is equal to or greater than a second reference value that is greater than the first reference value.

According to an embodiment of the inventive concept, subsequent to the bandwidth of the at least one nonvolatile memory being decreased, the memory controller restores the bandwidth of the at least one nonvolatile memory upon a determination that the determined temperature of the at least one nonvolatile memory has decreased to a temperature at least less than the second reference value.

According to an embodiment of the inventive concept, the at least one temperature sensor comprises a plurality of temperature sensors in which each one temperature sensor is arranged substantially adjacent a respective nonvolatile memory of the plurality of nonvolatile memories.

The memory controller may further include a delay buffer to delay data transmission to the at least one nonvolatile memory.

The memory controller may be further configured to tune an operational condition of the at least one nonvolatile memory during a transition from the first program operation to the second program operation by transmitting data to the delay buffer.

The memory controller may be further configured to tune an operational condition of the at least one nonvolatile memory during a transition from the first program operation to the second program operation by controlling a decrease in an operating frequency of the at least one nonvolatile memory.

According to the example embodiments of the inventive concept, it may be possible to minimize performance degradation of the storage device while preventing the temperature of the memory from excessively increasing. Accordingly, the storage device may consume a small amount of power, and data reliability may be increased. Further, the memory of the storage device may be prevented from being suddenly damaged due to heat, and thus lifespan of the storage device may not be rapidly shortened.

BRIEF DESCRIPTION OF THE DRAWINGS

FIG. 4 is a flowchart illustrating an example operation of a storage device of FIG. 2.

FIG. 8 is a table illustrating an example of information which is managed by a memory controller of FIG. 2.

FIGS. 9 and 10 are conceptual diagrams illustrating example methods of managing memory areas of nonvolatile memories of FIG. 2.

DETAILED DESCRIPTION

Herein below, at least one embodiment of the inventive concept will be described clearly and in detail with reference to the accompanied drawings, so that a person of ordinary skill in the art to which the present disclosure belongs would readily implement the inventive concepts.

Figure 1:
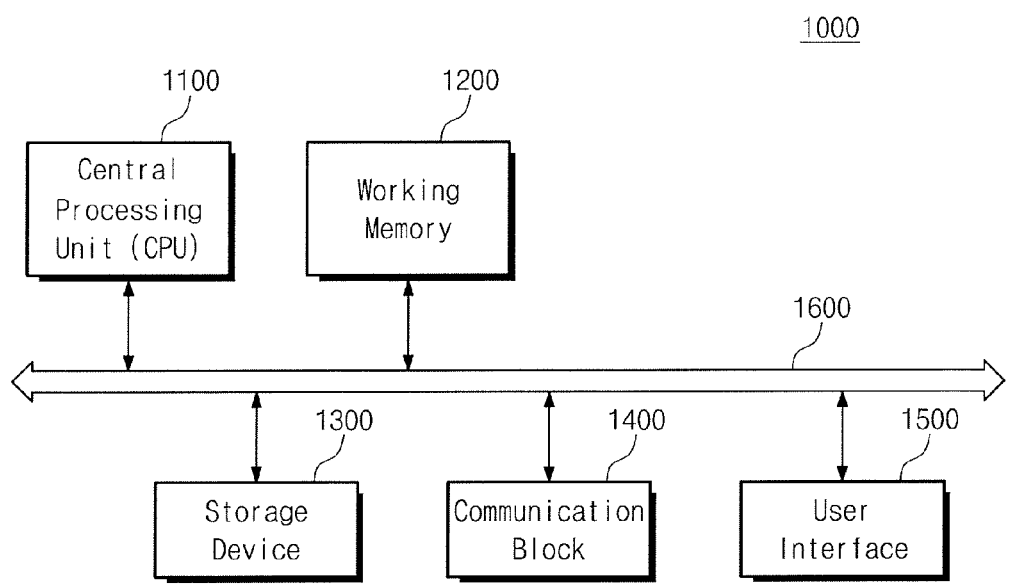
FIG. 1 is a block diagram illustrating an example configuration of a computing device which includes a storage device according to some example embodiments.

FIG. 1 is a block diagram illustrating an exemplary configuration of a computing device which includes a storage device according to at least one embodiment of the inventive concept.

A computing device 1000 may include, for example, a central processing unit (CPU) 1100, a working memory 1200, a storage device 1300, a communication block 1400, a user interface 1500, and a bus 1600. The computing device 1000 may be one of various electronic devices including but in no way limited to a desktop computer, a laptop computer, a tablet computer, a smart phone, a wearable device, a video game console, a workstation, a server, and/or the like.

The CPU 1100 may control overall operations of the computing device 1000. The CPU 1100 may process various kinds of arithmetical operations and/or logical operations. To this end, the CPU 1100 comprises hardware such as, for example, a special-purpose logic circuit (e.g., field programmable gate arrays (FPGA), application specific integrated circuits (ASICs), and/or the like) which is configured to process the operations. For example, the CPU 1100 may be implemented with a general-purpose processor or microprocessor, a special-purpose processor, and/or an application processor which includes one or more processor cores.

The working memory 1200 may store data used in an operation of the computing device 1000. For example, the working memory 1200 may temporarily store data processed or to be processed by the CPU 1100. The working memory 1200 may be used, for example, as a buffer or a cache of the computing device 1000. For example, the working memory 1200 may include a volatile memory, such as a static random access memory (SRAM), a dynamic RAM (DRAM), a synchronous DRAM (SDRAM), and/or the like, and/or a nonvolatile memory, such as a flash memory, a phase-change RAM (PRAM), a magneto-resistive RAM (MRAM), a resistive RAM (ReRAM), a ferro-electric RAM (FRAM), and/or the like.

With continued reference to FIG. 1, the storage device 1300 may include one or more nonvolatile memories and a memory controller. The nonvolatile memories of the storage device 1300 may store data regardless of whether or not power is being continuously supplied. For example, the storage device 1300 may include a nonvolatile memory, such as a flash memory, a PRAM, a MRAM, a ReRAM, a FRAM, and/or the like. For example, the storage device 1300 may include a storage medium, such as a solid state drive (SSD), a card storage, an embedded storage, and/or the like.

The communication block 1400 may communicate with an external device/system of the computing device 1000. For example, the communication block 1400 may include one or more interfaces that may support at least one of various wireless communication protocols, such as long term evolution (LTE), Worldwide Interoperability for Microwave Access (WIMAX), global system for mobile communication (GSM), code division multiple access (CDMA), Bluetooth, near field communication (NFC), wireless fidelity (Wi-Fi), radio frequency identification (RFID), and/or the like, and/or at least one of various wired communication protocols, such as transfer control protocol/Internet protocol (TCP/IP), universal serial bus (USB), Firewire, and/or the like.

With continued reference to FIG. 1, the user interface 1500 may facilitate a communication between a user and the computing device 1000. For example, the user interface 1500 may include, for example, an input interface, such as a keyboard, a mouse, a keypad, a button, a touch panel, a touch screen, a touch pad, a touch ball, a camera, a microphone, a gyroscope sensor, a vibration sensor, and/or the like. For example, the user interface 1500 may include an output interface, such as a liquid crystal display (LCD), a light emitting diode (LED) display, an organic LED (OLED) display, an active matrix OLED (AMOLED) display, a speaker, a motor, and/or the like.

The bus 1600 is arranged to provide communication paths between components of the computing device 1000. In addition, the components of the computing device 1000 may exchange data with one another based on the format of the bus 1600. For example, the bus format may include at least one of various interface protocols, such as USB, small computer small interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), universal flash storage (UFS), and/or the like, just to name some non-limiting possibilities.

The storage device 1300 may be implemented according to at least one of the exemplary embodiments of the present disclosure. For example, the storage device 1300 may differently operate depending on temperature of a nonvolatile memory included therein. For example, the storage device 1300 may control and/or activate different operational schemes depending on the temperature of the nonvolatile memory such that the temperature of the nonvolatile memory does not excessively increase. Example configurations and example operations of the storage device 1300 will now be described with reference to FIGS. 2 to 20.

Although the storage device 1300 and the nonvolatile memory are provided in the following descriptions, the exemplary embodiments of the inventive concept are not limited thereto. The inventive concept may be employed in any type of device which includes a memory device. The example embodiments of the inventive concept may also be applied to operations of the volatile memory and/or the nonvolatile memory included in the working memory 1200. The following descriptions are provided to facilitate better understanding, and are not intended to limit the present disclosure.

Figure 2:
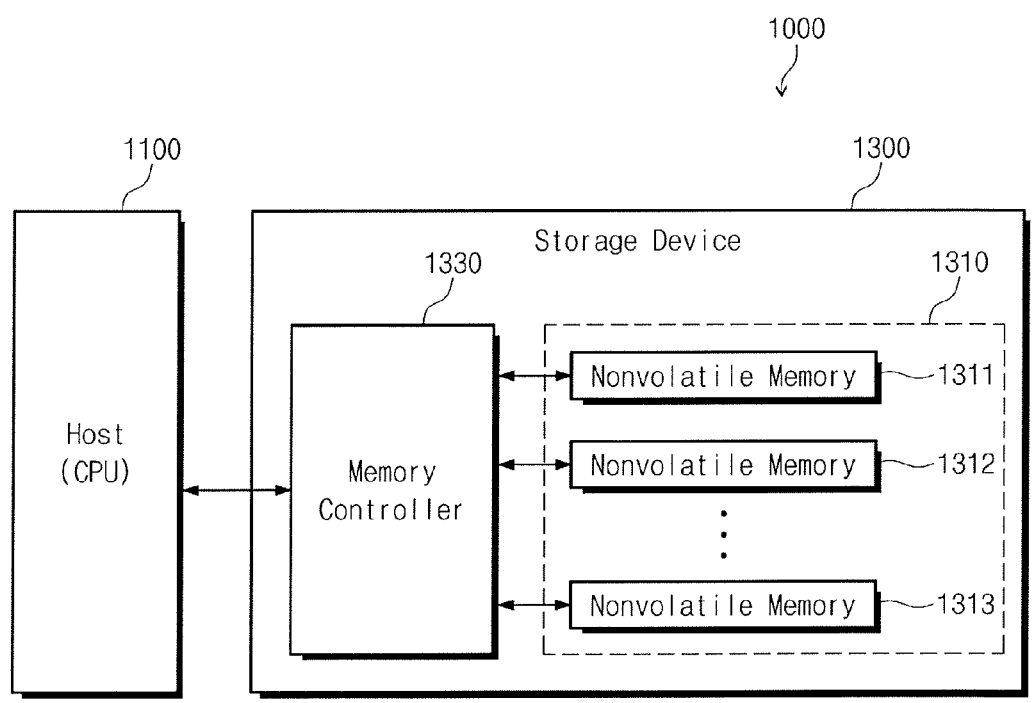
FIG. 2 is a block diagram illustrating an example configuration of a storage device of FIG. 1.

FIG. 2 is a block diagram illustrating an exemplary configuration of a storage device of FIG. 1.

As described with reference to FIG. 1, the CPU 1100 may communicate with the storage device 1300 through the bus 1600. In the present disclosure, an object which is capable of access to the storage device 1300 may be referred to as a "host". The CPU 1100 is one example of objects that may become the host, and may be referred to as a host 1100 below.

The host 1100 may exchange data with the storage device 1300. The storage device 1300 may provide a storage service to the host 1100 in response to a command received from the host 1100.

For example, the host 1100 may transmit to the storage device 1300 a write command and data which includes write data. The storage device 1300 may store requested write data in response to the write command. For example, the host 1100 may transmit a read command to the storage device 1300. The storage device 1300 may output read data to the host 1100 in response to receiving the read command.

The storage device 1300 may include one or more nonvolatile memories 1310 and a memory controller 1330. A person of ordinary skill in the art should understand and appreciate that he number of nonvolatile memories included in the storage device 1300 shown in FIG. 2 may be variously changed or modified.

With continued reference to FIG. 2, each of the nonvolatile memories 1311, 1312, and 1313 may store data requested by the host 1100. To this end, each of the nonvolatile memories 1311, 1312, and 1313 may include memory areas to store data. For example, when each of the nonvolatile memories 1311, 1312, and 1313 includes a NAND-type flash memory, each of the nonvolatile memories 1311, 1312, and 1313 may include a memory cell array formed along a plurality of word lines and a plurality of bit lines. However, a type and a configuration of each of the nonvolatile memories 1311, 1312, and 1313 may be variously changed or modified from the arrangement shown in the drawings.

The memory controller 1330, which comprises hardware such as integrated circuits, may control overall operations of the storage device 1300. For example, the memory controller 1330 may schedule operations of the nonvolatile memories 1311, 1312, and 1313, and/or may encode and decode signals/data read from the storage device 1300. For example, the memory controller 1330 may control a program operation on the nonvolatile memories 1311, 1312, and 1313, and thus data requested by the host 1100 may be stored in the nonvolatile memories 1311, 1312, and 1313.

Each of the nonvolatile memories 1311, 1312, and 1313 may output data requested by the host 1100. For example, a read operation may be performed on data stored in the nonvolatile memories 1311, 1312, and 1313 under control of the memory controller 1330. Thus, data stored in the nonvolatile memories 1311, 1312, and 1313 may be provided to the host 1100.

In addition, for example, an internal management operation (e.g., a read reclaim, a garbage collection, and/or the like) may be performed on data stored in the nonvolatile memories 1311, 1312, and 1313 under control of the memory controller 1330. For example, the memory controller 1330 may manage a wear level of each of the nonvolatile memories 1311, 1312, and 1313. The wear level may be associated with the number of times where a specific nonvolatile memory has been accessed, and thus a high wear level may indicate that the remaining lifespan of the specific nonvolatile memory is relatively short. The memory controller may use this information regarding the wear level to utilize other nonvolatile memories with a relatively lower wear level to as much as possible, substantially equalize usage. It is possible, for example, to move heavily accessed data to another nonvolatile memory with a lower wear level than the specific nonvolatile memory.

Meanwhile, when the temperature of the nonvolatile memories 1311, 1312, and 1313 increase, the storage device 1300 may operate with larger power consumption than when the temperatures of the nonvolatile memories are lower, and operational performance of the storage device 1300 may be degraded at the increased temperatures.

Moreover, the temperature of the nonvolatile memories 1311, 1312, and 1313 may excessively increase to the point where the nonvolatile memories 1311, 1312, and 1313 may be physically damaged. This excessive increase in temperature may cause an error or loss of data stored in the nonvolatile memories 1311, 1312, and 1313 and may shorten the overall lifespan of the storage device 1300.

Accordingly, in an example embodiment of the inventive concept, the storage device 1300 may manage the temperature of the nonvolatile memories 1311, 1312, and 1313 under control of the memory controller 1330. One way the temperature may be managed is to restrict usage of the nonvolatile memories to reduce the amount of heat that may be generated. The reduction in usage may be realized in different manners. For example, there can be fewer overall operations to read/write data from the nonvolatile memories, or the types of operations performed on the nonvolatile memories may be changed to reduce the generation of heat, at least until the temperature of the nonvolatile memories 1312, 1312, 1313 is reduced to an amount where any restrictions on usage can be withdrawn.

For example, the memory controller 1330 may collect information associated with the temperature of the nonvolatile memories 1311, 1312, and 1313. When the temperature of the nonvolatile memories 1311, 1312, and 1313 increase to be equal to or greater than a reference value, the memory controller 1330 may change operations of the nonvolatile memories 1311, 1312, and 1313.

Figure 3A:
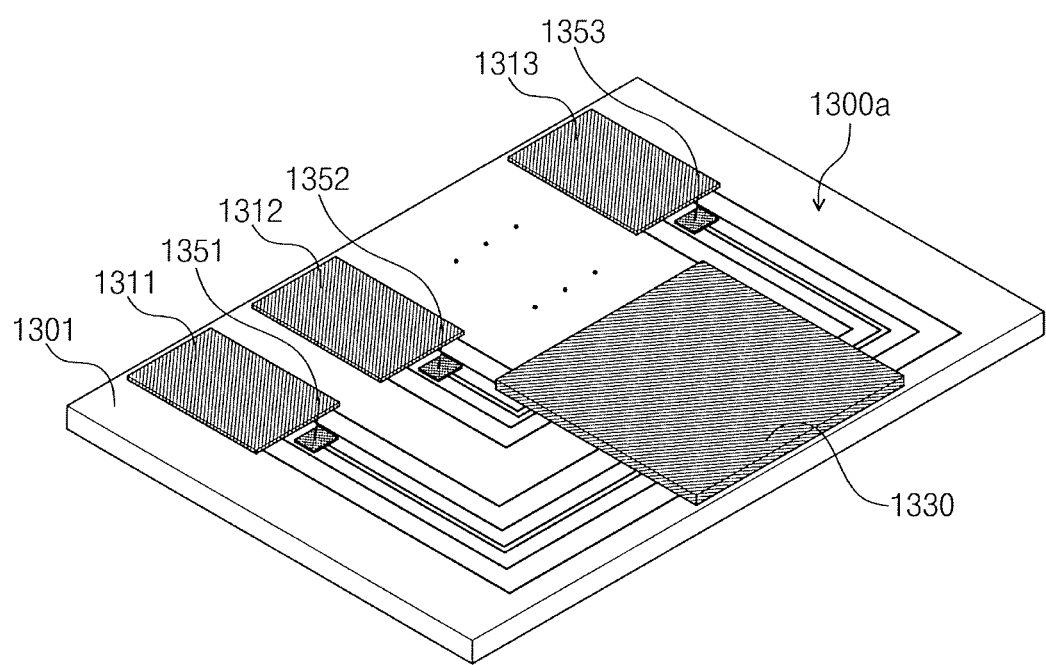
FIGS. 3A and 3B are conceptual diagrams illustrating example implementations of a storage device of FIG. 2.

FIG. 3A is a conceptual diagram illustrating an example implementation of a storage device of FIG. 2. In some example embodiments, the storage device 1300 of FIG. 2 may be implemented like a storage device 1300a of FIG. 3A.

The nonvolatile memories 1311, 1312, and 1313 and the memory controller 1330 of the storage device 1300a may be mounted or assembled on a printed circuit board (PCB) 1301. However, there are many ways to mount the nonvolatile memories and the memory controller to the PCB 1301 than shown in FIG. 3A. The memory controller 1330 may be connected to the nonvolatile memories 1311, 1312, and 1313 through conductive patterns which are provided on the PCB 1301. For example, the conductive pattern may include conductive material, such as a wire pattern, a trace pattern, and/or the like.

In some example embodiments of the inventive concept, the storage device 1300a may include temperature sensors 1351, 1352, and 1353. In this particular example, there is shown one temperature sensor for each respective nonvolatile memory. However, there can be more or fewer temperature sensors than shown. The temperature sensors 1351, 1352, and 1353 may be mounted or assembled on the PCB 1301. The temperature sensors 1351, 1352, and 1353 may be connected to the memory controller 1330 through conductive patterns which are provided on the PCB 1301.

For example, the temperature sensors 1351, 1352, and 1353 may be disposed around (e.g., beside, adjacent) the nonvolatile memories 1311, 1312, and 1313 respectively. In other examples of the inventive concept, unlike the configuration illustrated in FIG. 3A, some or all of the temperature sensors 1351, 1352, and 1353 may be disposed on or inside of respective nonvolatile memories 1311, 1312, and 1313. In these exemplary constructions, the temperature sensors 1351, 1352, and 1353 may provide the memory controller 1330 with information associated with the temperature of the respective nonvolatile memories 1311, 1312, and 1313. Thus, the memory controller 1330 may measure, estimate, and/or predict the temperature of each of the nonvolatile memories 1311, 1312, and 1313.

Figure 3B:
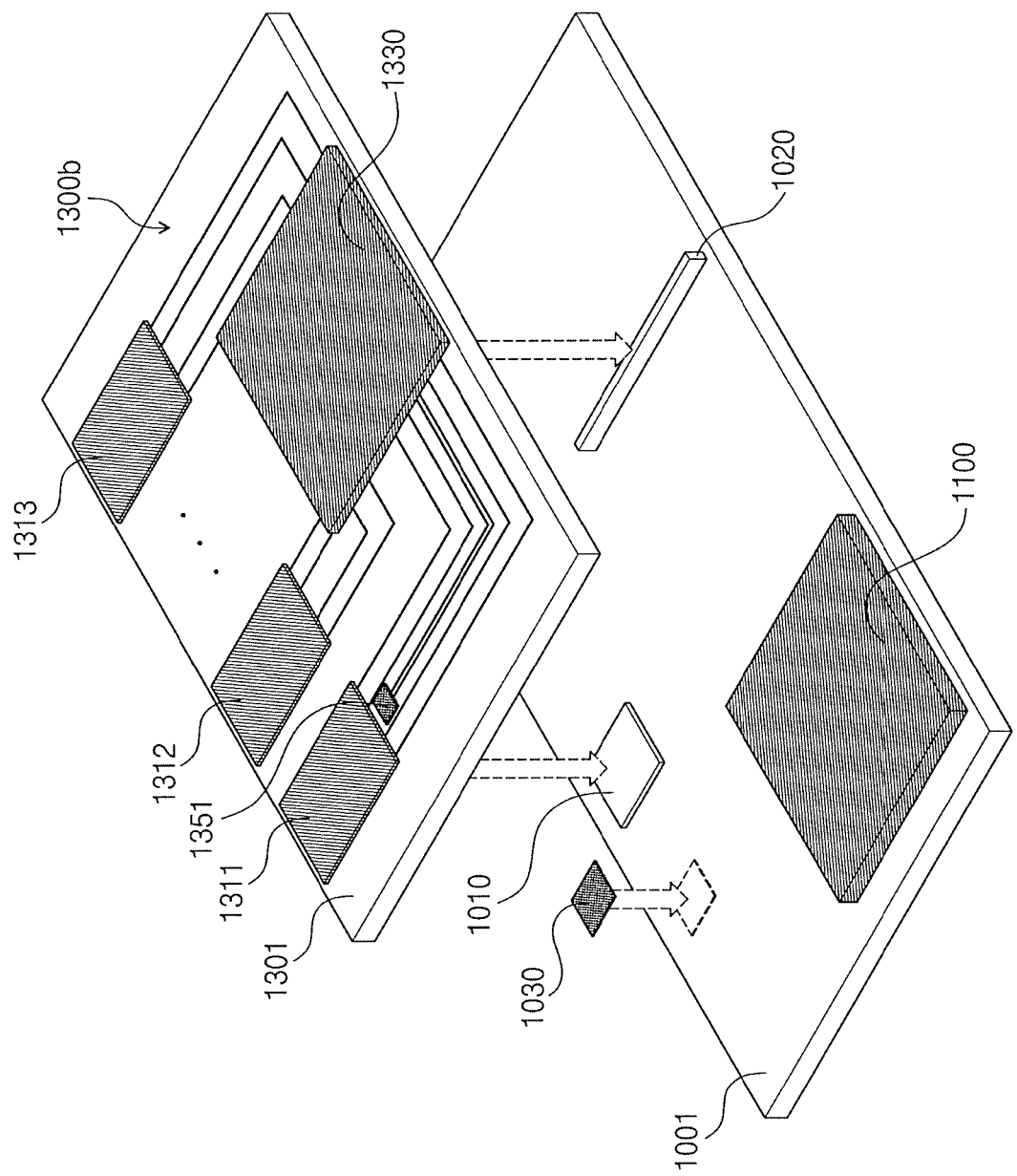

FIG. 3B is a conceptual diagram illustrating an example of an implementation of a storage device such as shown in FIG. 2. In some example embodiments, the storage device 1300 of FIG. 2 may be implemented with a construction of a storage device 1300b shown in FIG. 3B.

The nonvolatile memories 1311, 1312, and 1313 and the memory controller 1330 of the storage device 1300b may be mounted or assembled on a PCB 1301. The memory controller 1330 may be connected to the nonvolatile memories 1311, 1312, and 1313 through conductive patterns which are provided on the PCB 1301. In some example embodiments of the inventive concept, the storage device 1300b may include at least one temperature sensor 1351. The temperature sensor 1351 may be mounted or assembled on the PCB 1301. The temperature sensor 1351 may be connected to the memory controller 1330 through conductive patterns which are provided on the PCB 1301.

Unlike the storage device 1300a of FIG. 3A, the storage device 1300b may include only one temperature sensor 1351. The memory controller 1330 may receive information associated with temperature from the temperature sensor 1351. The memory controller 1330 may estimate or predict temperature of each of the nonvolatile memories 1311, 1312, and 1313, based on the received information from the temperature sensor 1351.

For example, the memory controller 1330 may obtain information associated with at least one offset between the temperature measured by the temperature sensor 1351 and a temperature of each of the nonvolatile memories 1311, 1312, and 1313 in advance (e.g., in advance before the storage device 1300 operates). The memory controller 1330 may estimate or predict the temperature of each of the nonvolatile memories 1311, 1312, and 1313, based on the temperature measured by the temperature sensor 1351 and the offset information.

The offset information may be different depending on location/disposition/characteristic of each of the nonvolatile memories 1311, 1312, and 1313. For example, when the temperature sensor 1351 indicates temperature of 50°, actual temperature of the nonvolatile memory 1311 which is nearest to the temperature sensor 1351 may be 49° (offset=1) and the actual temperature of the nonvolatile memory 1313 which is farthest from the temperature sensor 1351 may be 40° (offset=10). For example, the offset information may be obtained through an experiment, a test and/or a simulation before the storage device 1300 operates.

For example, the offset information may be corrected or compensated by taking into account various factors, such as a surrounding condition, a spatial disposition, an element characteristic, an operational performance, and/or the like, of the components on the PCB 1301. For example, when the temperature sensor 1351 indicates temperature of 50°, actual temperature of the nonvolatile memory 1311 which is in an idle state may be 35° and actual temperature of the nonvolatile memory 1311 which operates with maximum performance may be 70°. Thus, an analysis of the various factors that can impact the output of the temperature sensor 1351 will assist in effective management of the storage device 1300. The memory controller 1330 may manage a variety of information to estimate or predict the temperature of each of the nonvolatile memories 1311, 1312, and 1313.

FIG. 3B illustrates that one temperature sensor 1351 is disposed near the nonvolatile memory 1311. However, a person of ordinary skill in the art should understand and appreciate that the number of temperature sensors and location of the temperature sensors may be variously changed or modified. For example, the temperature sensor 1351 may be disposed around another nonvolatile memory, or may be disposed on or inside the nonvolatile memory 1311. One or more additional temperature sensors may be further provided.

The storage device 1300b may be equipped, mounted, or assembled on a main board 1001. For example, the storage device 1300b may be connected to a port 1010 through a wire cable, or may be equipped in a slot 1020 through a connector. Thus, the storage device 1300b may communicate with the CPU 1100, which is mounted or assembled on the main board 1001, according to various constructions.

In some example embodiments of the inventive concept, the temperature sensor 1030 may be mounted or assembled on the main board 1001. There may be one or more temperature sensors on the storage device 1300b as well as being arranged on the main board.

In addition, the temperature sensor 1030 may be provided outside the storage device 1300b, and may measure or estimate overall temperature of a system on the main board 1001. The memory controller 1330 may receive information associated with temperature from the temperature sensor 1030, to estimate or predict the temperature of each of the nonvolatile memories 1311, 1312, and 1313. The memory controller 1330 may use the temperature measured by the temperature sensor 1030 to estimate the temperature of each of the nonvolatile memories 1311, 1312, and 1313, taking into account spatial disposition of the storage device 1300b and the temperature sensor 1030.

With reference to FIG. 3A, the storage device 1300a may also be mounted or assembled on the main board 1001 in a same or similar manner as the storage device 1300b shown in FIG. 3B. For example, the memory controller 1330 may receive temperature information from the temperature sensors 1030, 1351, 1352, and/or 1353 of FIGS. 3A and 3B periodically or if appropriate in view of certain specified conditions. For example, when a particular condition is satisfied (e.g., when a command is received from the host 1100 of FIG. 2), the memory controller 1330 may receive the temperature information from one or more of the temperature sensors 1030, 1351, 1352, and/or 1353 of FIGS. 3A and 3B. However, these examples are provided to facilitate understanding of the inventive concept, and the example embodiments may be variously changed or modified.

FIG. 4 is a flowchart describing an example of an operation of a storage device of FIG. 2. For ease of explanation, FIGS. 2 and 4 will be referred to together.

In operation S110, the memory controller 1330 of the storage device 1300 may receive data from the host 1100. For example, the received data may include a write command and write data.

In operation S120, the memory controller 1330 may determine (or estimate) temperature of a target nonvolatile memory. Herein, the target nonvolatile memory may refer to a nonvolatile memory which is selected, from among the nonvolatile memories 1311, 1312, and 1313, by the memory controller 1330 to store data requested by the host 1100. The memory controller 1330 may determine the temperature of the target nonvolatile memory based on a temperature measured by at least one of the temperature sensors 1030, 1351, 1352, and/or 1353 (such as shown in FIGS. 3A and 3B).

In operation S130, the memory controller 1330 may compare the determined temperature of the target nonvolatile memory with a reference value Tref1. For example, the reference value Tref1 may indicate a reference temperature of a case where the temperature of the target nonvolatile memory is increasing and attention is recommended. The memory controller 1330 may take corrective measures associated with decreasing the temperature of the target nonvolatile memory to be explained herein below. The reference value Tref1 may be selected to have a suitable value to prevent damage on the target nonvolatile memory. In other words, the value may be sufficiently low so that if the measured (or estimated) temperature is greater than Tref1, there would be sufficient time to undertake corrective action that may prevent heat-related damage from occurring to the storage device 1300. The value selected for the reference value Tref1 may be varied according to need and/or in view of previously-measured (or estimated) data.

When the determined temperature of the target nonvolatile memory is smaller than the reference value Tref1, a first program operation S135 may be performed. In operation S135, the memory controller 1330 may control a first program operation such that data is stored in the target nonvolatile memory. When the determined temperature at operation S130 is not greater than Tref1, the first program operation may be, for example, any operation typically associated with the nonvolatile memory of the storage device 1300.

With continued reference to operation S130 in FIG. 4, when the determined temperature of the target nonvolatile memory is equal to or greater than the reference value Tref1, operation S140 may be performed. In operation S140, the memory controller 1330 may compare the determined temperature of the target nonvolatile memory with another reference value Tref2 to ascertain whether the determined temperature is sufficiently high (e.g. greater than Tref2) to warrant actions that would provide for a more substantial decrease in the temperature of the target nonvolatile memory.

According to the inventive concept, the reference value Tref2 may be greater than the reference value Tref1, and for example, may indicate the temperature of a case where the temperature of the target nonvolatile memory has excessively increased. At the reference value Tref2, it may be likely that the target nonvolatile memory is damaged or is about to be damaged. The reference value Tref2 may also be variously selected and changed to have a suitable value below a temperature that may cause damage the target nonvolatile memory so as to permit time to take correction actions which may include controlling a second program operation to be described below.

When the determined temperature of the target nonvolatile memory is smaller than the reference value Tref2, operation S145 may be performed. In operation S145, the memory controller 1330 may control a second program operation such that data is stored in the target nonvolatile memory.

For example, the second program operation performed in S145 may include a program operation that consumes a smaller amount of power than the first program operation of operation S135. The second program operation may use less power than a current operation, and less power than the first program operation, and a reduced temperature of the target nonvolatile memory may result. When a program operation performed on the target nonvolatile memory consumes a relatively large amount of power, the temperature of the target nonvolatile memory may continuously increase. Thus, when the determined temperature of the target nonvolatile memory is equal to or greater than the reference value Tref1, the second program operation may be performed to prevent the temperature of the target nonvolatile memory from excessively increasing (e.g. increasing to be equal to or greater than the reference value Tref2). The second program operation may result in the temperature of the nonvolatile memory decreasing faster than if the first program operation is performed. The operation of the nonvolatile memory according to the second program operation may be performed in terms of power consumption, data reliability, and lifespan of the target nonvolatile memory.

On the other hand, when the determined temperature of the target nonvolatile memory is smaller than the reference value Tref1, the first program operation may be performed on the target nonvolatile memory. The first program operation may be performed without consideration of the determined temperature of the target nonvolatile memory.

Furthermore, when the determined temperature of the target nonvolatile memory is equal to or greater than the reference value Tref2, operation S150 may be performed. In operation S150, the memory controller 1330 may control the target nonvolatile memory to decrease a bandwidth for the target nonvolatile memory. When the bandwidth for the target nonvolatile memory decreases, an amount of power consumed by the target nonvolatile memory may be reduced, A reduced bandwidth may result in the temperature of the target nonvolatile memory decreasing to a level where other operations may be performed.

According to the example embodiments of the inventive concept, the storage device 1300 may operate differently depending on the temperature of the target nonvolatile memory. When the temperature of the target nonvolatile memory increases, the memory controller 1330 may change an operational scheme to decrease the temperature of the target nonvolatile memory below a certain reference value. Thus, the inventive concept may prevent the temperature of the target nonvolatile memory from excessively increasing.

Decreasing the bandwidth in operation S150 may effectively decrease the temperature of the target nonvolatile memory. However, decreasing the bandwidth may degrade overall performance of the storage device 1300 and may be disadvantageous for a user. Thus, in the example embodiments, such as shown in the flowchart in FIG. 4, the memory controller 1330 may try to control the second program operation in operation S145, prior to decreasing the bandwidth. As will be described below, the second program operation (e.g. S145) may be selected so as to refrain from a degrading a performance of the storage device 1300.

Figure 6:
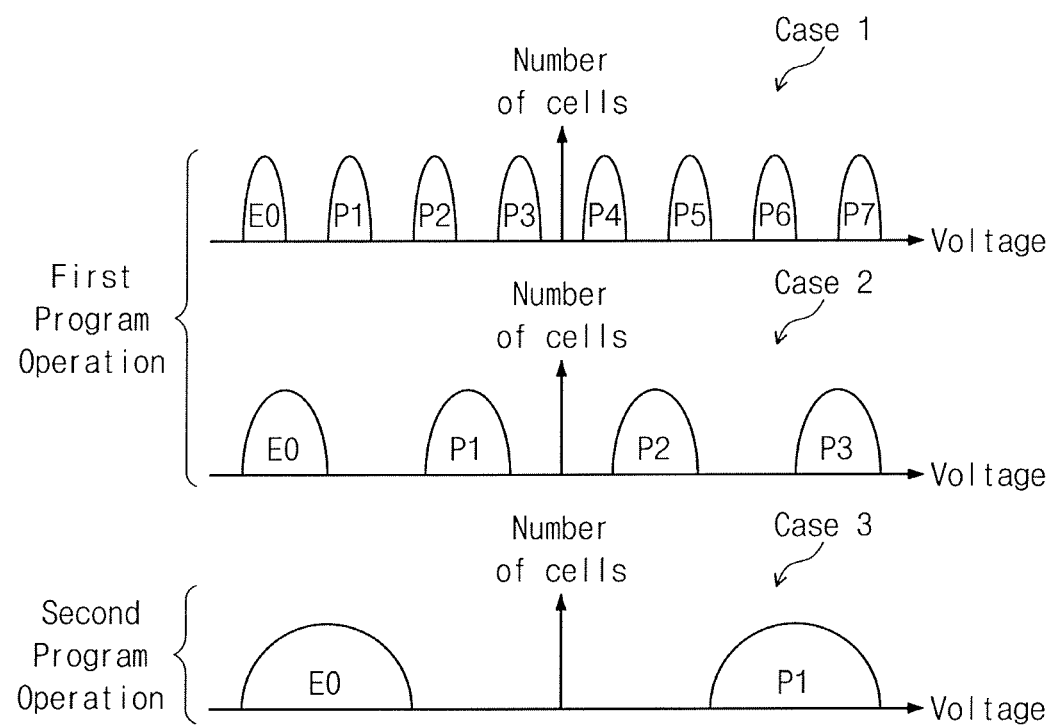
FIG. 6 is a graph illustrating example program operations of a storage device of FIG. 2.
Figure 13:
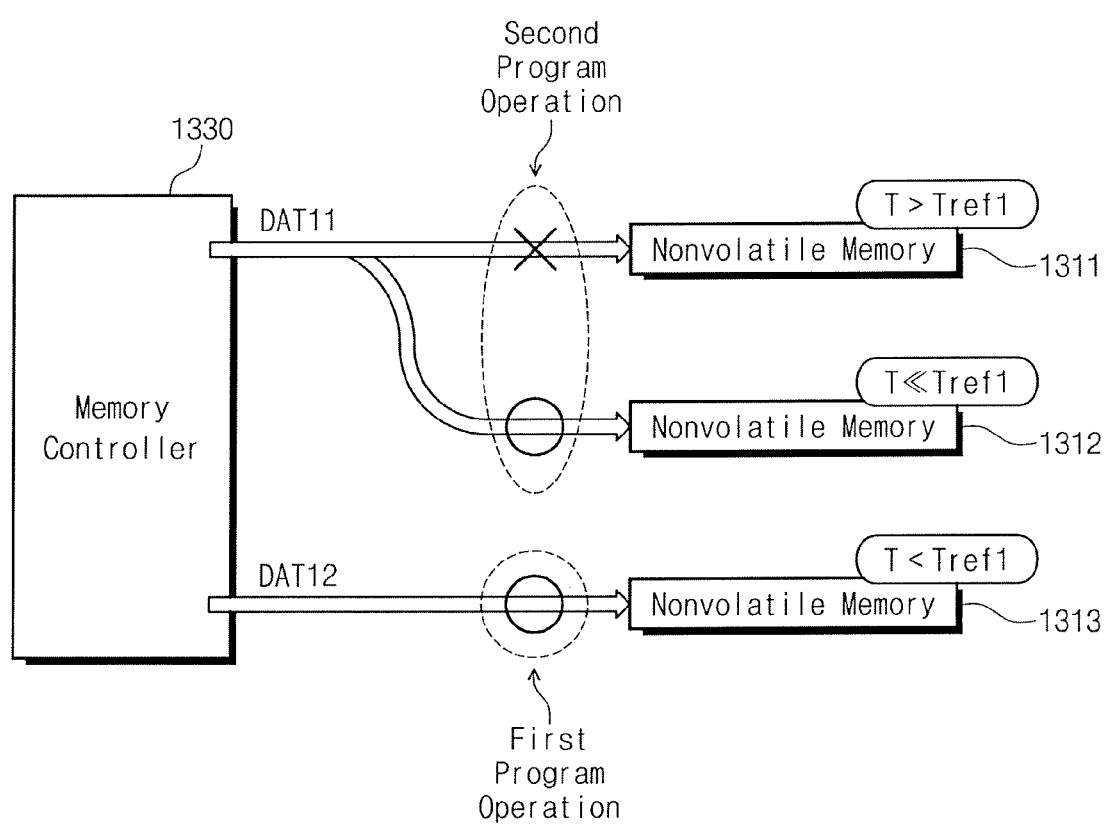
FIG. 13 is a conceptual diagram illustrating example program operations of a storage device of FIG. 2.

With continued reference to FIG. 4, the first program operation of operation S135 and the second program operation of operation S145 may be variously changed or modified. FIGS. 6 and 13 will illustrate some examples associated with the first program operation and the second program operation, to facilitate understanding of the inventive concept by a person of ordinary skill in the art. However, the inventive concept is not limited to the examples shown and described herein, and there can be various changes or modifications made to manage the temperature of the nonvolatile memory.

Operation S160 may be performed after the operations S135, S145, and S150. In operation S160, the memory controller 1330 may determine whether storing data is finished. When storing data is not finished, the memory controller 1330 may successively determine the temperature of the target nonvolatile memory in operation S120. On the other hand, when storing data is finished, the example operation of FIG. 4 may be ended.

Figure 5:
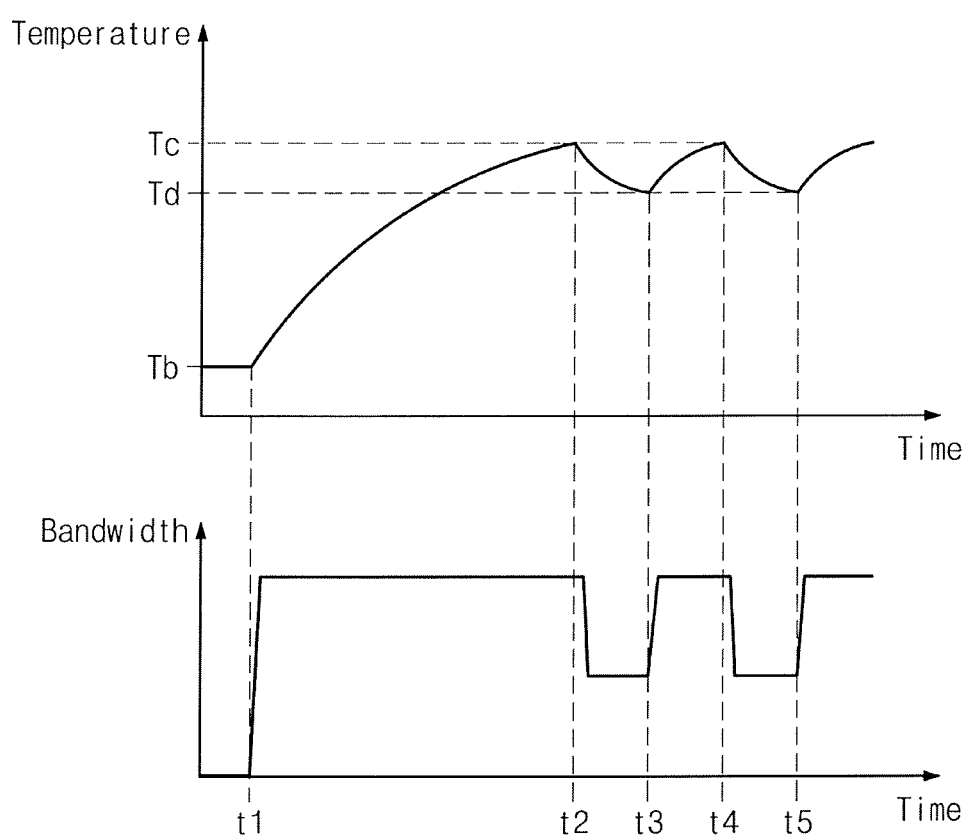
FIG. 5 is a graph illustrating an example operation of a storage device of FIG. 2.

FIG. 5 illustrates an example of a operation of a storage device such as shown in FIG. 2. To facilitate better understanding, FIGS. 2 and 5 will be referred to together.

Referring to FIG. 5, when the target nonvolatile memory is not operating (e.g. time before time 't1'), the temperature of the target nonvolatile memory may be 'Tb'. The bandwidth of the target nonvolatile memory, which is a rate at which data may be written to or read from, may be restricted to reduce the power consumed by the target nonvolatile memory, and result in a decreased temperature of the storage device 1300.

As the target nonvolatile memory begins to operate from time 't1', the bandwidth for the target nonvolatile memory may increase and the temperature of the target nonvolatile memory may also increase to 'Tc'. For example, the temperature 'Tc' may be a temperature sufficiently high that may cause damage to the target nonvolatile memory.

For example, after time 't2', the memory controller 1330 may decrease the bandwidth for the target nonvolatile memory (refer to operation S150 of FIG. 4). Thus, the temperature of the target nonvolatile memory may decrease to 'Td'.

The memory controller 1330 may recognize decrease in the temperature of the target nonvolatile memory, and at time 't3', may increase the bandwidth for the target nonvolatile memory again. Thus, the temperature of the target nonvolatile memory may increase to the 'Tc' again. At time 't4' and time 't5', the increase/decrease in the temperature of the target nonvolatile memory and increase/decrease in the bandwidth for the target nonvolatile memory may be repeated. Thus, there can be a fluctuation during the operative periods, such as during t2 through t5, both in temperature, and in bandwidth, with a resultant fluctuation in performance due to the bandwidth being varied.

Decreasing the bandwidth may be effective to decrease the temperature of the target nonvolatile memory, but as previously indicated herein above, may also degrade performance of the storage device 1300. Thus, in the example embodiments, decreasing the bandwidth may be performed, for example, when a condition is indicative that damage and data lost may occur (e.g. a "dangerous condition"). Instead, according to the inventive concept, the memory controller 1330 may first try to perform other operation (e.g., the second program operation of operation S145 of FIG. 4) that consumes a smaller amount of power prior to decreasing the bandwidth of the target nonvolatile memory. In this way, a temperature of the target nonvolatile memory may be decreased sufficiently before performing a more restrictive action, which is to decrease the bandwidth.

FIG. 6 is a graph illustrating some example program operations of a storage device such as shown in FIG. 2. A first program operation and a second program operation are discussed.

For example, the nonvolatile memories 1311, 1312, and 1313 of FIG. 2 may include flash memories. A memory cell of the flash memory may be a single-level cell (SLC)

capable of storing one (1) bit, a multi-level cell (MLC) capable of storing two (2) bits, or a triple-level cell (TLC) capable of storing three (3) bits. For example, memory cells of the nonvolatile memories 1311, 1312, and 1313 may include TLCs or MLCs.

With reference to FIG. 6, a first case illustrates a voltage distribution with regards to the states of the triple-level cell TLC. As the triple level cell has 3 bits, there are $2^3$ states (e.g. 8 states) shown in case 1. The TLC may have one state among an erase state E0 and program states P1 to P7 according to a threshold voltage.

A second case of FIG. 6 illustrates a voltage distribution in regards to states of the MLC. As the MLC is capable of storing two (2) bits (e.g. 4 states), the MLC may have one state among an erase state E0 and program states P1 to P3 according to a threshold voltage.

A third case of FIG. 6 illustrates a voltage distribution in regards to states of the SLC. As the SLC is capable of storing one bit (e.g. 2 states), the SLC may have an erase state E0 or a program state P1 according to a threshold voltage.

Accordingly, program operations may be preformed to cause the various flash memories have a specific state. For example, a triple-level cell program operation (TLC program operation) may be performed to make the TLC have a specific state. A multi-level cell program operation (MLC program operation) may be performed to make the MLC have a specific state. A single-level cell program operation (SLC program operation) may be performed to make the SLC have a specific state.

In some cases, the SLC program operation may be performed even on the TLC or the MLC. In such cases, the TLC or the MLC may be programmed to have only the program state P1, instead of having one among several program states P1 to P7 or P1 to P3 respectively.

As shown in FIG. 6, the first program operation, the TLC and the MLC may have the larger number of states than the SLC. Moreover, a margin between states of the TLC and a margin between states of the MLC may be smaller than a margin between states of the SLC. Thus, the TLC program operation and the MLC program operation may accompany the large number of times of voltage applying operations, to precisely make the TLC and the MLC have a specific state. Consequently, the TLC program operation and the MLC program operation may consume a larger amount of power than the SLC program operation.

In some example embodiments of the inventive concept, the first program operation of operation S135 of FIG. 4 may include the TLC program operation or the MLC program operation. Further, the second program operation of operation S145 of FIG. 4 may include the SLC program operation.

In these example embodiments of the inventive concept, the second program operation may result in a lesser quantity of times voltage applying operations occur than when compared with the first program operation. Thus, the second program operation may consume a smaller amount of power than the first program operation. Meanwhile, the second program operation is different from the first program operation in terms of a manner for storing data, and but the second program operation may not provide a lower performance than the first program operation.

Figure 7:
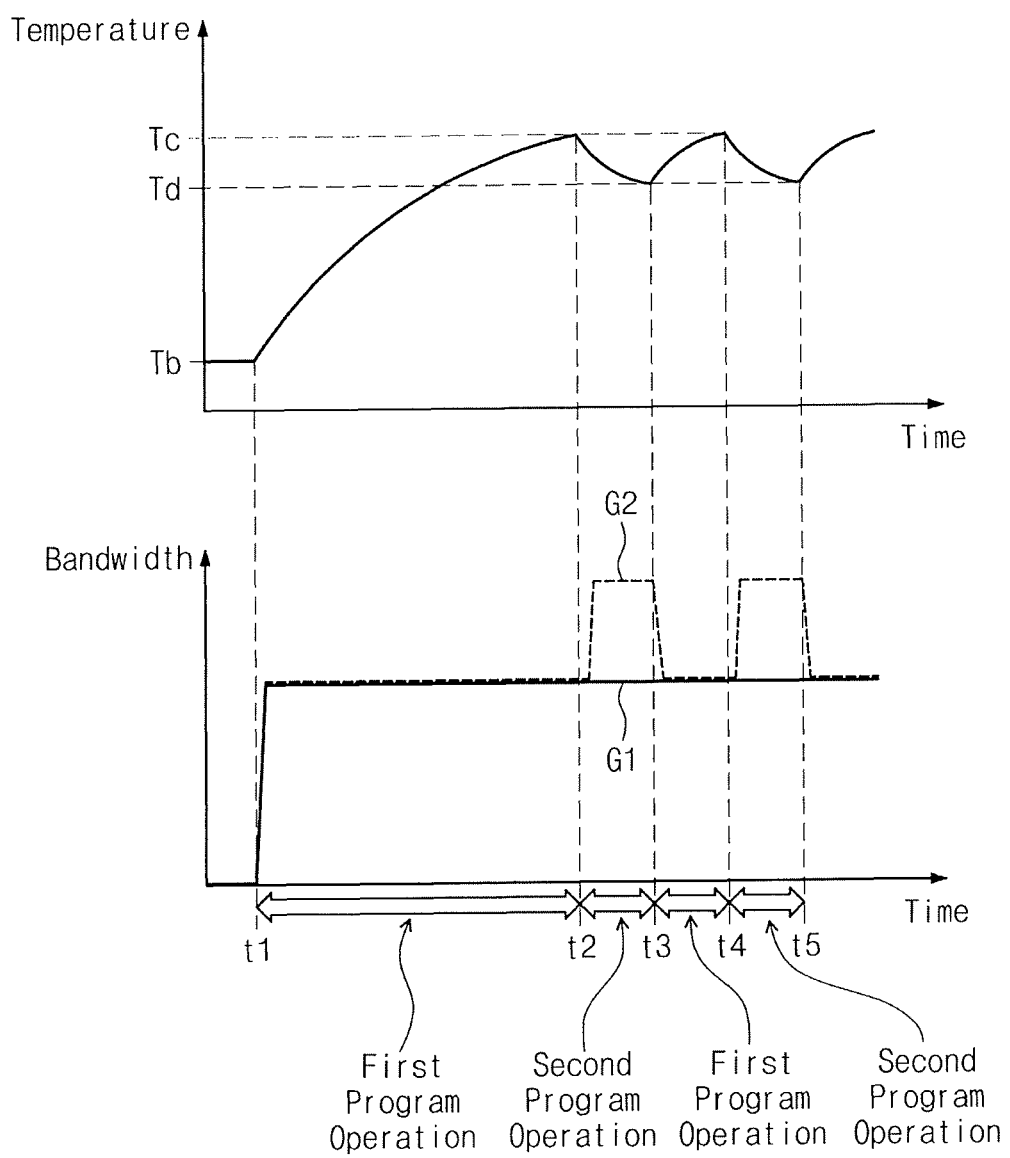
FIG. 7 is a graph illustrating an example operation of a storage device of FIG. 2 which employs example program operations of FIG. 6.

FIG. 7 is a graph illustrating an example of an operation of a storage device of FIG. 2 which employs example program operations of FIG. 6.

While the target nonvolatile memory in this example is not operational before time 't1', the temperature of the target nonvolatile memory may be 'Tb'. As shown in FIG. 7, the target nonvolatile memory begins to operate from time 't1', the bandwidth for the target nonvolatile memory and the temperature of the target nonvolatile memory may increase. The memory controller 1330 of FIG. 2 may control the first program operation (e.g., the TLC or MLC program operation) on the target nonvolatile memory, until the temperature of the target nonvolatile memory reaches 'Tc'.

At time 'T2', the temperature of the target nonvolatile memory may increase to the 'Tc'. The memory controller 1330 may control the second program operation (e.g., the SLC program operation) on the target nonvolatile memory, to prevent the temperature of the target nonvolatile memory from excessively increasing. The second program operation may be continued until the temperature of the target nonvolatile memory reaches 'Td' at time 't3'.

When the temperature of the target nonvolatile memory decreases to the 'Td', the memory controller 1330 may control the first program operation again on the target nonvolatile memory. In this manner, increase/decrease in the temperature of the target nonvolatile memory may be repeated at time 't4' and time 't5', and thus the first program operation and the second program operation may be alternately performed.

Meanwhile, for example, when the memory controller 1330 simply changes the first program operation to the second program operation at time 't2', the bandwidth for the target nonvolatile memory may somewhat increase along a dotted line G2. This increase occurs because an amount of bits transmitted according to the second program operation is smaller than an amount of bits transmitted according to the first program operation and thus additional bits may occupy a portion of bandwidth. However, an increase in the bandwidth may not be desirable when the second program operation is executed in part to decrease the temperature of the target nonvolatile memory.

Thus, the memory controller 1330 may tune an operating condition of the target nonvolatile memory while changing from the first program operation to the second program operation. The memory controller 1330 may tune the operating condition of the target nonvolatile memory such that the bandwidth for the target nonvolatile memory remains equivalent during the first program operation and the second program operation (refer to a solid line G1).

Herein, the phrase "the bandwidth remains equivalent" should not be interpreted as meaning that the bandwidth for the target nonvolatile memory remains physically constant. Rather, the phrase "the bandwidth remains equivalent" refers to a bandwidth for the target nonvolatile memory during the first program operation may be substantially equal to a bandwidth for the target nonvolatile memory during the second program operation, and the bandwidth for the target nonvolatile memory may not greatly vary during the first program operation and the second program operation.

For example, the memory controller 1330 may delay data transmission to the target nonvolatile memory to tune the operating condition of the target nonvolatile memory. To this end, in some example embodiments, the memory controller 1330 may include a delay buffer. In some example embodiments, the memory controller 1330 may adjust (e.g., decrease) an operating frequency of the target nonvolatile memory, to tune the operating condition of the target nonvolatile memory. However, these example embodiments are provided to facilitate understanding by a person of ordinary skill in the art, and the inventive concept is not limited in this regard.

When the operating condition of the target nonvolatile memory is tuned, the bandwidth for the target nonvolatile memory may remain equivalent (along the solid line G1) even if the first program operation is changed to the second program operation. Thus, the temperature of the target nonvolatile memory may decrease more effectively. Further, as compared with the case of FIG. 5, the bandwidth for the target nonvolatile memory may not decrease in the case of FIG. 7, and thus performance of the storage device 1300 of FIG. 2 may not be degraded.

FIG. 8 is a table illustrating an example of information which is managed by a memory controller of FIG. 2. To facilitate understanding of this embodiment, FIG. 2 will be referred to together with FIG. 8.

The memory controller 1330 may manage information INF in regards to which data is stored in the nonvolatile memories 1311, 1312, and 1313, which address area data is stored in, and which program operation is controlled to store data.

The information INF may include information associated with a correspondence relationship between data stored in the nonvolatile memories 1311, 1312, and 1313 and an address of a memory area in which the data is stored. The information INF may include information associated with whether the data of the nonvolatile memories 1311, 1312, and 1313 is stored according to the first program operation or according to the second program operation.

Some pieces of data may be stored according to a single manner of program operation. For example, as shown in FIG. 8, data DAT1 may be stored according to the first program operation, and data DAT3 may be stored according to the second program operation. Some pieces of data may be stored according to several program operations. For example, a portion of the data DAT2 may be stored according to the first program operation, and the other portion of the data DAT2 may be stored according to the second program operation.

For example, when the nonvolatile memories 1311, 1312, and 1313 include TLCs and the second program operation includes a SLC program operation, each TLC may be programmed at only one program state P1 even though each TLC may have several program states P1 to P7 (refer to FIG. 6). Thus, as compared with a TLC program operation on the TLC, the SLC program operation on the TLC may require a larger size (e.g., a larger storage capacity) of a memory area to store the same data. In some example embodiments of the inventive concept, additional management operations may be provided to manage data stored according to the second program operation. The management operations will be described with reference to FIGS. 9 to 11.

FIG. 9 is a conceptual diagram illustrating an example method of managing memory areas of nonvolatile memories of FIG. 2.

In some example embodiments, the memory controller 1330 of FIG. 2 may limit a size of a memory area which is programmed according to the second program operation in the nonvolatile memories 1311, 1312, and 1313. The memory controller 1330 may control the nonvolatile memories 1311, 1312, and 1313 such that the size of the memory area programmed according to the second program operation in the nonvolatile memories 1311, 1312, and 1313 does not exceed the limited size.

For example, as illustrated in FIG. 9, the memory controller 1330 may allow only 20% memory area of each of the nonvolatile memories 1311, 1312, and 1313 to be programmed according to the second program operation. For example, when the 20% memory area of each of the nonvolatile memories 1311, 1312, and 1313 is programmed according to the second program operation, the memory controller 1330 may allow only a first program operation for the remaining 80% memory area of each of the nonvolatile memories 1311, 1312, and 1313.

When the size of the memory area programmed according to the second program operation is limited, the memory area may be prevented from being rapidly run out, and efficiency of memory management may be increased. Further, it may be possible to prevent lifespan of the nonvolatile memories 1311, 1312, and 1313 from being rapidly shortened.

However, the value of 20% is provided for illustrative purposes, and is not intended to limit the inventive concept. An absolute and/or relative size of a memory area programmed according to the second program operation may be variously changed or modified. Further, location (e.g., address) of the memory area programmed according to the second program operation may be fixed or may dynamically vary for each nonvolatile memory. In some example embodiments, some nonvolatile memories may be configured so as not to be programmed according to the second program operation.

For example, a size of a memory area programmed according to the first program operation may be equally or differently selected for each nonvolatile memory. For example, the size of the memory area programmed according to the first program operation may be individually selected for each nonvolatile memory, or may be selected taking into account the whole size of the nonvolatile memories 1311, 1312, and 1313.

Figure 10:
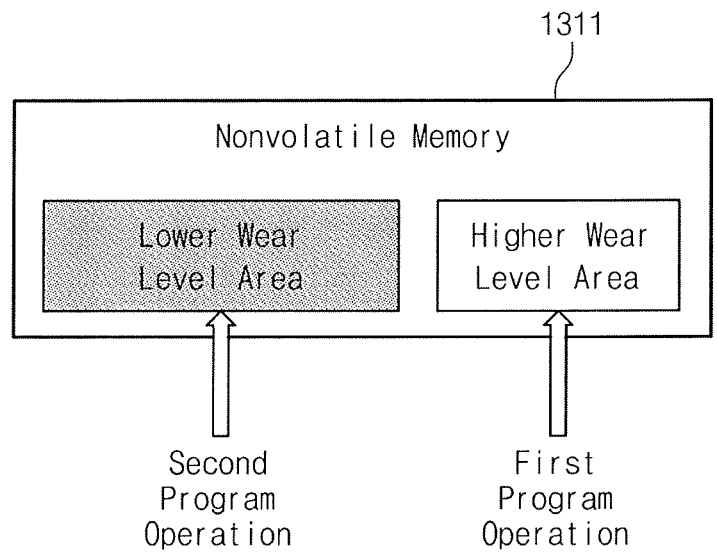

FIG. 10 is a conceptual diagram illustrating an example of a method of managing memory areas of nonvolatile memories of FIG. 2. To facilitate better understanding, FIG. 2 will be referred to together with FIG. 10.

As described above, as compared with the first program operation, the second program operation may require a larger size of a memory area of the nonvolatile memories 1311, 1312, and 1313 to store the same data. Thus, as compared with the first program operation, the second program operation may further affect the lifespan of the nonvolatile memories 1311, 1312, and 1313.

In some example embodiments, the second program operation may be performed on a memory area which has a relatively lower wear level than a memory area on which the first program operation is performed. The first program operation may be performed on a memory area which has a relatively higher wear level. For example, when a wear level of a first memory area of the nonvolatile memory 1311 is lower than a wear level of a second memory area of the nonvolatile memory 1311, the memory controller 1330 may control the nonvolatile memory 1311 such that the second program operation is performed on the first memory area.

In some example embodiments of the inventive concept, a memory area having a wear level which is higher than a reference value may be programmed according to only the first program operation. When the second program operation is performed on a memory area which has a lower wear level, the lifespan of the nonvolatile memories 1311, 1312, and 1313 may be more uniformly managed in general, and this approach may be helpful to extend the whole lifespan of the storage device 1300.

FIG. 10 illustrates two memory areas having different wear levels within one nonvolatile memory 1311. However, in some example embodiments, controlling a program operation based on a wear level may be considered between separate nonvolatile memories (e.g., between the nonvolatile memory 1311 and the nonvolatile memory 1312), rather than portions of the same one nonvolatile memory. For example, when wear levels of memory areas of the nonvolatile memory 1311 are lower than wear levels of memory areas of the nonvolatile memory 1312, the second program operation may be performed mainly on the nonvolatile memory 1311.

Figure 11:
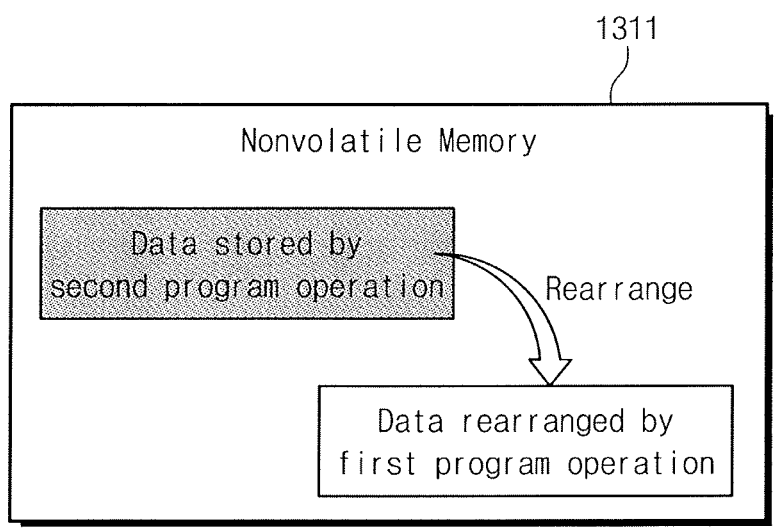
FIG. 11 is a conceptual diagram illustrating an example method of rearranging data which is stored in nonvolatile memories of FIG. 2.

FIG. 11 is a conceptual diagram illustrating an example of a method of rearranging data which is stored in nonvolatile memories of FIG. 2. To facilitate better understanding, FIG. 2 will be referred to along with FIG. 11.

For example, the nonvolatile memory 1311 may store data according to the second program operation. In some example embodiments, the memory controller 1330 may control the nonvolatile memories 1311, 1312, and 1313 such that data stored in the nonvolatile memory 1311 according to the second program operation is rearranged according to the first program operation. For example, the rearranging operation may be performed during an idle time period where the components of the storage device 1300 do not operate. For example, the rearranging operation may be performed together with the internal management operation during a management time period in which the memory controller 1330 performs the internal management operation.

For example, when certain data is stored in the nonvolatile memory 1311 according to the SLC program operation, the memory controller 1330 may read the stored data and may store the read data in the nonvolatile memory 1311 according to the TLC or MLC program operation, during the idle time period or the management time period. Thus, only a manner for storing data may be changed while maintaining contents of data, and the data may be rearranged.

As described above, as compared with the first program operation, the second program operation may require a larger size of a memory area of the nonvolatile memories 1311, 1312, and 1313 to store the same data. Thus, when an amount of data stored according to the second program operation increases, the efficiency of memory management may decline and the lifespan of the nonvolatile memories 1311, 1312, and 1313 may be rapidly shortened. Further, reading data from the larger size of the memory area may degrade performance of a read operation.

Thus, rearranging the data, which is stored according to the second program operation, according to the first program operation may increase storage efficiency, lifespan, and operational performance. One of the reasons for the aforementioned increases may be that when the data stored according to the second program operation is rearranged according to the first program operation, the rearranged data may be stored in a smaller size of a memory area.

FIG. 11 illustrates that data stored in the nonvolatile memory 1311 is rearranged within the same nonvolatile memory (e.g. nonvolatile memory 1311). However, the rearranging operation may be considered between separate nonvolatile memories (e.g., between the nonvolatile memory 1311 and the nonvolatile memory 1312). For example, data stored in the nonvolatile memory 1311 according to the second program operation may be rearranged in the nonvolatile memory 1312 according to the first program operation. For example, to perform the rearranging operation, the memory controller 1330 may analyze various factors, such as a size of a memory area being programmed according to the second program operation in each nonvolatile memory, a wear level of each nonvolatile memory, and/or the like.

Figure 12:
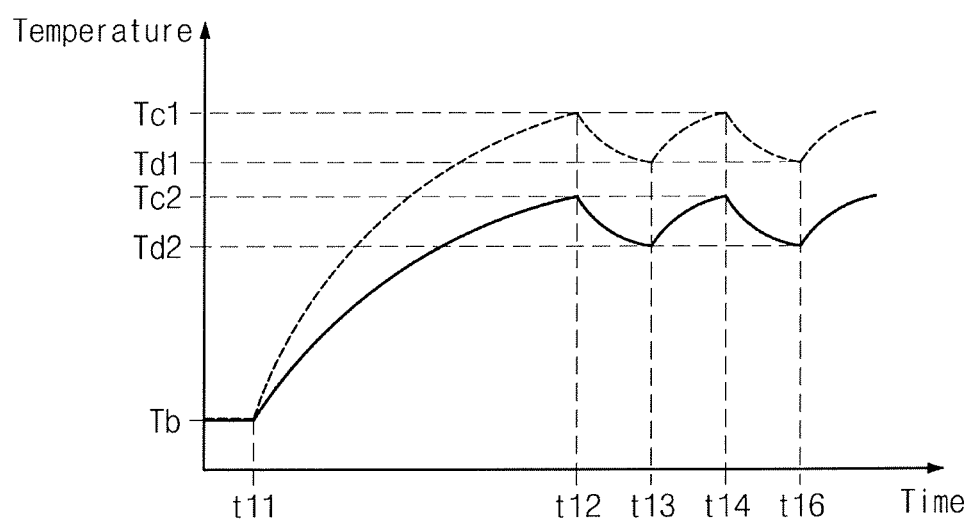
FIG. 12 is a graph illustrating an example operation of a storage device of FIG. 2.

FIG. 12 is a graph illustrating an example operation of a storage device of FIG. 2. Two nonvolatile memories will be considered with reference to the graph of FIG. 12.

The temperature of each of the nonvolatile memories may be 'Tb' while the two nonvolatile memories are not operational before time 't11'. As the nonvolatile memories begin to operate from time "T11', the temperature of each of the nonvolatile memories may increase, as shown in FIG. 12.

For example, taking into account a first nonvolatile memory, at time 't12', the temperature of the first nonvolatile memory may increase to 'Tc1'. For example, the temperature 'Tc1' may be temperature that causes damage on the nonvolatile memories. Thus, from time 't12', the memory controller 1330 of FIG. 2 may control operations of the nonvolatile memories (e.g., may decrease a bandwidth for each of the nonvolatile memories) such that the temperature of each of the nonvolatile memories does not increase.

Afterwards, at time 't13', the temperature of the first nonvolatile memory may decrease to 'Td1'. Thus, the memory controller 1330 may control the nonvolatile memories such that the bandwidth for each of the nonvolatile memories increases again, and thus the temperature of each of the nonvolatile memories may increase again. In this manner, increase/decrease in the temperature of each of the nonvolatile memories may be repeated at time 't14' and time 't16'.

Meanwhile, taking into account the second nonvolatile memory, the temperature of the second nonvolatile memory may increase to 'Tc2' while the temperature of the first nonvolatile memory increases to 'Tc1'. At time 't12', the temperature of the second nonvolatile memory does not reach a level that may cause damage on the second nonvolatile memory. Nevertheless, the memory controller 1330 controls the operations of the nonvolatile memories such that the temperature of each of the nonvolatile memories does not increase, and thus a bandwidth for the second nonvolatile memory may decrease.

In this case, even though it is permissible to further increase the temperature of the second nonvolatile memory, from time 't12', the operational performance of the second nonvolatile memory may be degraded in conjunction with decrease in the bandwidth for the first nonvolatile memory. The bandwidth for the second nonvolatile memory may increase again, after the temperature of the first nonvolatile memory decreases to the 'Td1' and the temperature of the second nonvolatile memory reaches 'Td2' at time 't13'.

FIG. 12 illustrates that a desired result in terms of performance may not always be achieved when uniform control of operations of the plurality of nonvolatile memories occur. Thus, in the example embodiments, the operations of the plurality of nonvolatile memories may be independently controlled based on their respective temperature.

FIG. 13 is a conceptual diagram illustrating an example of program operations of a storage device such as shown in FIG. 2.

As an example to facilitate understanding by a person of ordinary skill in the art, a current temperature of the nonvolatile memory 1311 may be higher than the reference value Tref1. On the other hand, current temperature of each of the nonvolatile memories 1312 and 1313 may be lower than the reference value Tref1. The current temperature of the nonvolatile memory 1312 may be lower than the current temperature of the nonvolatile memory 1313.

The memory controller 1330 may transmit data DAT11 and data DAT12 to at least one of the nonvolatile memories 1311, 1312, and/or 1313. For example, the memory controller 1330 may select the nonvolatile memory 1311 as a target nonvolatile memory to store the data DAT11. For example, the data DAT11 may be directed to the nonvolatile memory 1311.

However, the memory controller 1330 may determine that the current temperature of the nonvolatile memory 1311 is higher than the reference value Tref1. In this case, the memory controller 1330 may transmit the data DAT11 to the nonvolatile memory 1312 instead of transmitting the data DAT11 to the nonvolatile memory 1311. For example, when the current temperature of the nonvolatile memory 1311 is equal to or higher than the reference value Tref1, the memory controller 1330 may transmit the data DAT11 to the nonvolatile memory 1312 which has the temperature lower than the reference value Tref1.

In some example embodiments, when the temperature of the nonvolatile memory 1311 is equal to or higher than the reference value Tref1, the memory controller 1330 may communicate with other nonvolatile memory 1312 prior to and/or instead of decreasing a bandwidth for the nonvolatile memory 1311. Accordingly, the operational performance of the storage device 1300 of FIG. 2 may not be degraded. Further, communicating with the nonvolatile memory 1312 which has lower temperature than the nonvolatile memory 1311 may be advantageous in terms of power consumption, lifespan, and data reliability.

Meanwhile, the memory controller 1330 may select the nonvolatile memory 1313 as a target nonvolatile memory to store the data DAT12. For example, the data DAT12 may be directed to the nonvolatile memory 1313. The current temperature of the nonvolatile memory 1313 is lower than the reference value Tref1, and thus it may be allowable to store the data DAT12 in the nonvolatile memory 1313. Thus, the memory controller 1330 may transmit the data DAT12 to the nonvolatile memory 1313.

In some example embodiments, the first program operation of operation S135 of FIG. 4 may include transmitting data to a nonvolatile memory which has temperature lower than the reference value Tref1. Further, the second program operation of operation S145 of FIG. 4 may include transmitting data to a nonvolatile memory which has temperature lower than the reference value Tref1 instead of transmitting the data to a nonvolatile memory which has temperature equal to or higher than the reference value Tref1.

In these example embodiments, the second program operation may be performed on a nonvolatile memory having a relatively low temperature. The second program operation may consume a small amount of power, which may account for the relative low temperature. On the other hand, the second program operation accompanies a change of the target nonvolatile memory, and does not to provide lower performance than the first program operation.

Further, in these example embodiments, the memory controller 1330 may perform the first program operation and the second program operation together. For example, transmitting the data DAT12 to the nonvolatile memory 1313 may be performed together with transmitting the data DAT11 to the nonvolatile memory 1312 instead of the nonvolatile memory 1311 (when the nonvolatile memory 1311 may have a temperature higher than a reference value). Herein, "performing together" may include not only performing at the same time (e.g., simultaneously) but also non-exclusively performing during different time periods (e.g., concurrently or in parallel).

Figure 14:
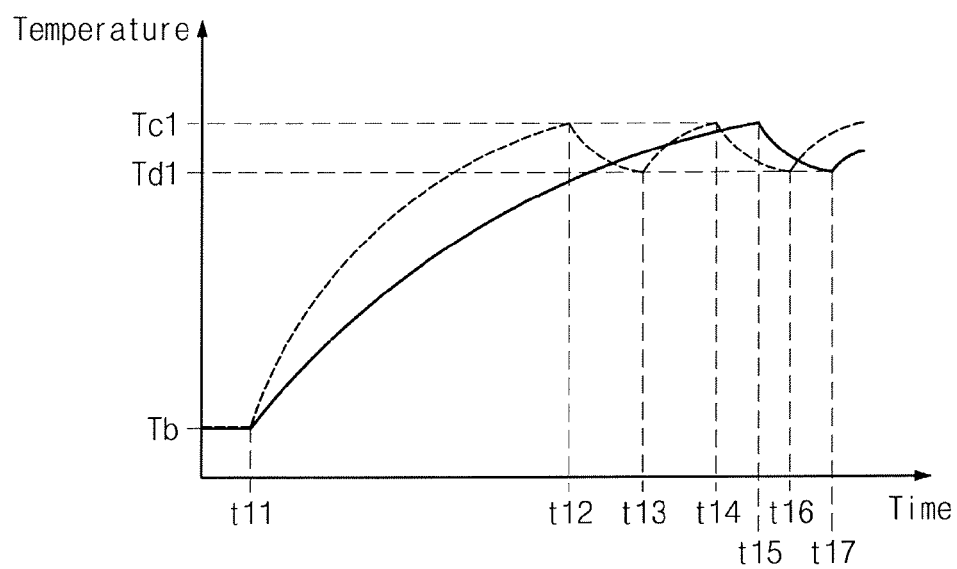
FIG. 14 is a graph illustrating an example operation of a storage device of FIG. 2 which employs example program operations of FIG. 13.

FIG. 14 is a graph illustrating an example of an operation of a storage device of FIG. 2 which employs example program operations of FIG. 13. To facilitate better understanding, FIG. 2 will be referred to together with FIG. 14.

As described above, the first program operation of FIG. 13 may be performed together with the second program operation of FIG. 13. For example, an operation of the nonvolatile memory 1311, an operation of the nonvolatile memory 1312, and an operation of the nonvolatile memory 1313 may be independently controlled based on the temperature of nonvolatile memory 1311, the temperature of nonvolatile memory 1312, and the temperature of nonvolatile memory 1313 respectively.

Thus, referring to FIG. 14, when the temperature of a first nonvolatile memory increases to 'Tc1' at time 't12', the memory controller 1330 may control the first nonvolatile memory such that the temperature of the first nonvolatile memory decreases. However, the memory controller 1330 may independently control a second nonvolatile memory based on temperature of the second nonvolatile memory irrespective of the temperature of the first nonvolatile memory. Thus, unlike as illustrated in FIG. 12, an operation of the second nonvolatile memory may not be changed at time 't12'.

The temperature of the second nonvolatile memory may increase until the temperature of the second nonvolatile memory reaches 'Tc1' at time 't15'. At time 't15', the memory controller 1330 may control the second nonvolatile memory such that the temperature of the second nonvolatile memory decreases. After the temperature of the second nonvolatile memory decreases to 'Td1' at time 't17', the memory controller 1330 may allow the temperature of the second nonvolatile memory to increase. FIG. 14 illustrates that independent control of the operations of the plurality of nonvolatile memories may contribute to an increase in terms of operational performance.

Figure 15:
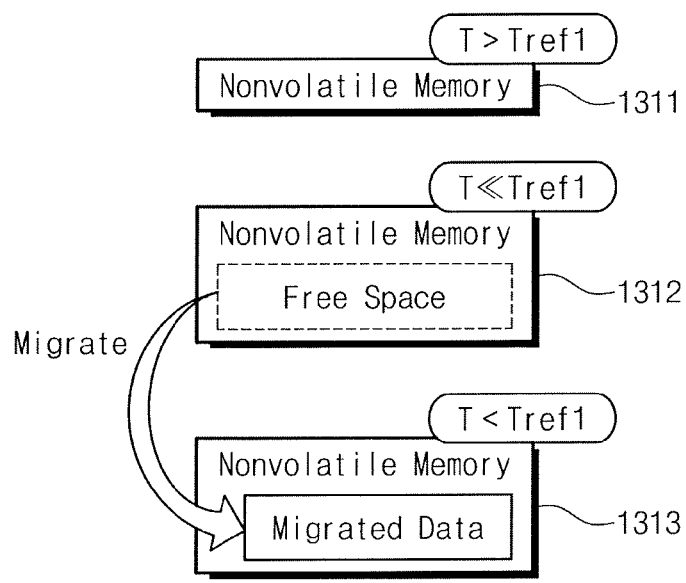
FIGS. 15 and 16 are conceptual diagrams illustrating example methods of migrating data which is stored in nonvolatile memories of FIG. 2.

FIG. 15 is a conceptual diagram illustrating an example of a method of migrating data which is stored in nonvolatile memories of FIG. 2.

As described with reference to FIG. 13, the data DAT11 directed to the nonvolatile memory 1311 may be transmitted to the nonvolatile memory 1312. However, when a size of the remaining available memory area of the nonvolatile memory 1312 is insufficient, the nonvolatile memory 1312 may not store the data DAT11.

Thus, for example, before transmitting the data DAT11 to the nonvolatile memory 1312, the memory controller 1330 of FIG. 2 may secure the available memory area of the nonvolatile memory 1312 in advance. For example, to secure the available memory area of the nonvolatile memory 1312, the memory controller 1330 may control the nonvolatile memories 1312 and 1313 such that data stored in the nonvolatile memory 1312 migrates to other nonvolatile memory (e.g., the nonvolatile memory 1313). Thus, the available memory area of the nonvolatile memory 1312 may be secured.

In some example embodiments, the memory controller 1330 may determine an alternative nonvolatile memory which has a relatively low temperature and is available to receive data instead of another nonvolatile memory. The memory controller 1330 may control nonvolatile memories such that data stored in the determined alternative nonvolatile memory migrates to other nonvolatile memory in advance. Accordingly, the available memory area of the alternative nonvolatile memory may be secured. For example, such a migration operation may be performed during an idle time period or a management time period.

Figure 16:
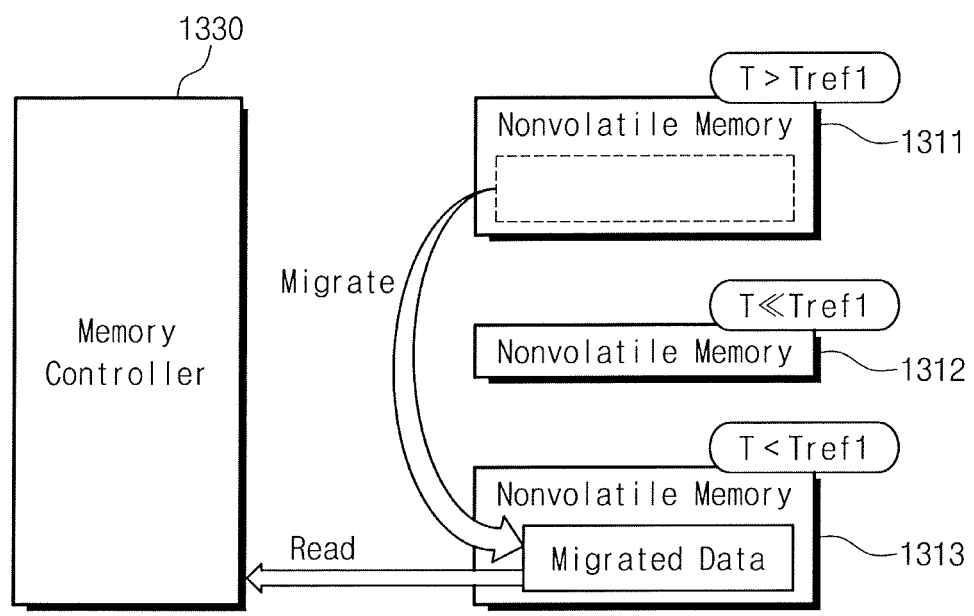

FIG. 16 is a conceptual diagram illustrating an example of a method of migrating data which is stored in nonvolatile memories of FIG. 2.

For example, the memory controller 1330 may trace average temperature of each of the nonvolatile memories 1311, 1312, and 1313 during a reference time period. The memory controller 1330 may determine that average temperature of the nonvolatile memory 1311 is higher than average temperature of each of the nonvolatile memories 1312 and 1313. In this case, before data stored in the nonvolatile memory 1311 is read, the memory controller 1330 may move the data stored in the nonvolatile memory 1311 to the nonvolatile memory 1313. Thus, the memory controller 1330 may read the data from the nonvolatile memory 1313.

Data stored in a nonvolatile memory having excessive high temperature may have a higher error rate, and/or such data may be lost/corrupted. Thus, in some example embodiments, the memory controller 1330 may control nonvolatile memories such that data stored in a nonvolatile memory having a higher average temperature migrates to a nonvolatile memory having a lower average temperature. This data migration may increase data reliability. For example, such a migration operation may be performed during an idle time period or a management time period before data is read.

Figure 17:
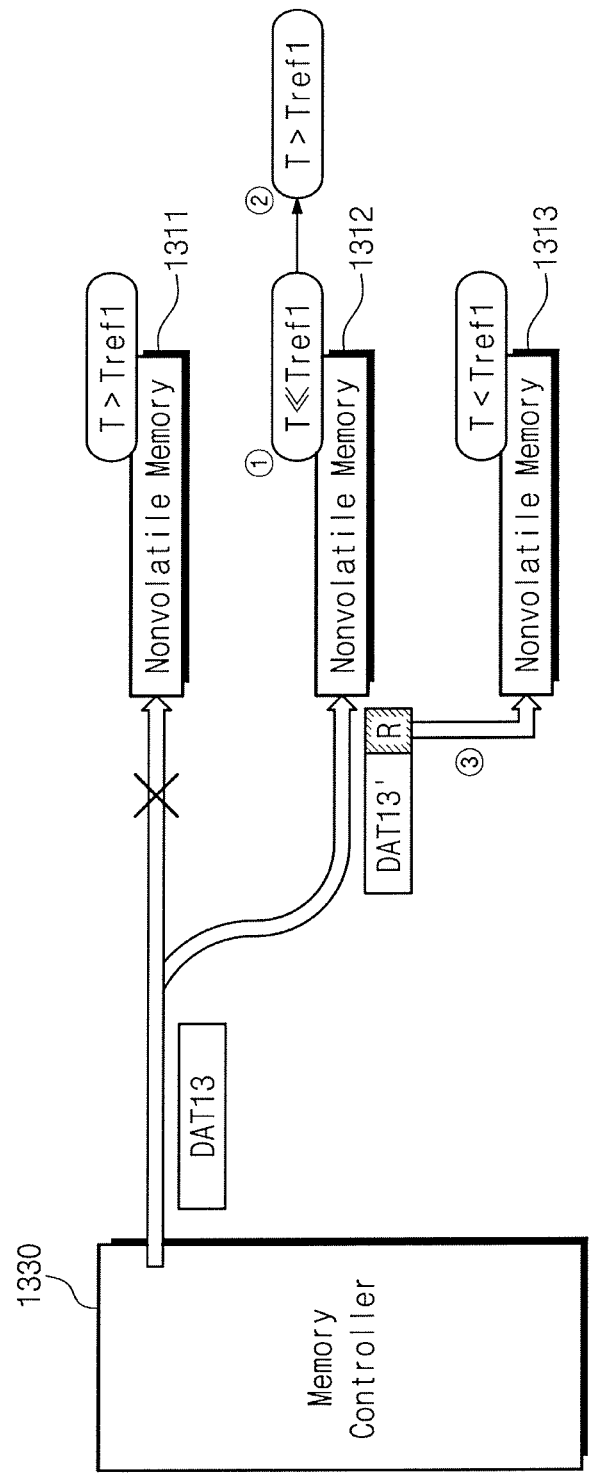
FIG. 17 is a conceptual diagram illustrating an example operation of a storage device of FIG. 2 which employs example program operations of FIG. 13.

FIG. 17 is a conceptual diagram illustrating an example of an operation of a storage device of FIG. 2 which employs example program operations of FIG. 13.

The memory controller 1330 may transmit data DAT13 to the nonvolatile memories 1311, 1312, and 1313. For example, the memory controller 1330 may select the nonvolatile memory 1311 as a target nonvolatile memory to store the data DAT13. For example, the data DAT13 may be directed to the nonvolatile memory 1311.

However, the memory controller 1330 may determine that current temperature of the nonvolatile memory 1311 is higher than the reference value Tref1. In some example embodiments, as described with reference to FIG. 13, the memory controller 1330 may transmit the data DAT13 to the nonvolatile memory 1312 instead of transmitting the data DAT13 to the nonvolatile memory 1311 when it is determined that the nonvolatile memory 1312 has a lower temperature that does not, for example, exceed a reference value.

Meanwhile, the temperature of the nonvolatile memory 1312 was lower than the reference value Tref1 initially, but the temperature of the nonvolatile memory 1312 may be changed to be equal to or higher than the reference value Tref1 while the data DAT13 is transmitted to the nonvolatile memory 1312. For example, as a portion DAT13' of the data DAT13 is stored in the nonvolatile memory 1312, the temperature of the nonvolatile memory 1312 may increase to be higher than the reference value Tref1.

Since the temperature of the nonvolatile memory 1312 increases, completely storing the remaining portion R of the data DAT13 (e.g. remaining part) in the nonvolatile memory 1312 may not be warranted in terms of power consumption, lifespan, and data reliability. Thus, in some example embodiments, the memory controller 1330 may transmit the remaining portion R of the data DAT13 to the nonvolatile memory 1313. Since the temperature of the nonvolatile memory 1313 is lower than the reference value Tref1, it may be advisable to store the remaining portion R of the data DAT13 in the nonvolatile memory 1313 in terms of power consumption, lifespan, and data reliability.

In some example embodiments, the memory controller 1330 may first change a program operation on the nonvolatile memory 1312 instead of immediately transmitting the remaining portion R of the data DAT13 to the nonvolatile memory 1313. For example, when the temperature of the nonvolatile memory 1312 is changed to be equal to or higher than the reference value Tref1, the memory controller 1330 may change a TLC or MLC program operation on the nonvolatile memory 1312 to an SLC program operation, as described with reference to FIGS. 6 and 7. In some cases, a nonvolatile memory controlled according to the SLC program operation may co-exist with a nonvolatile memory controlled according to the TLC or MLC program operation.

When a change of the program operation allows the temperature of the nonvolatile memory 1312 to decrease, the remaining portion R of the data DAT13 may be stored in the nonvolatile memory 1312. However, when the temperature of the nonvolatile memory 1312 does not decrease to be lower than the reference value Tref1 despite the change of the program operation, the remaining portion R of the data DAT13 may be transmitted to the nonvolatile memory 1313. The migration of data to a lower temperature nonvolatile memory has a lesser impact on a user than reducing the bandwidth of the current nonvolatile memory in which the data is stored to reduce a temperature via reduced power consumption.

In the above descriptions, some example embodiments of the first program operation and the second program operation have been provided for illustrative purposes. However, the above example embodiments are provided to facilitate understanding by a person of ordinary skill in the art, and the first and second program operations may be variously changed or modified to suitably manage the temperature of the nonvolatile memories 1311, 1312, and 1313. Further, the above example embodiments are not independent of one another, and may be complementarily employed as will be described with reference to FIGS. 18 and 19.

Figure 18:
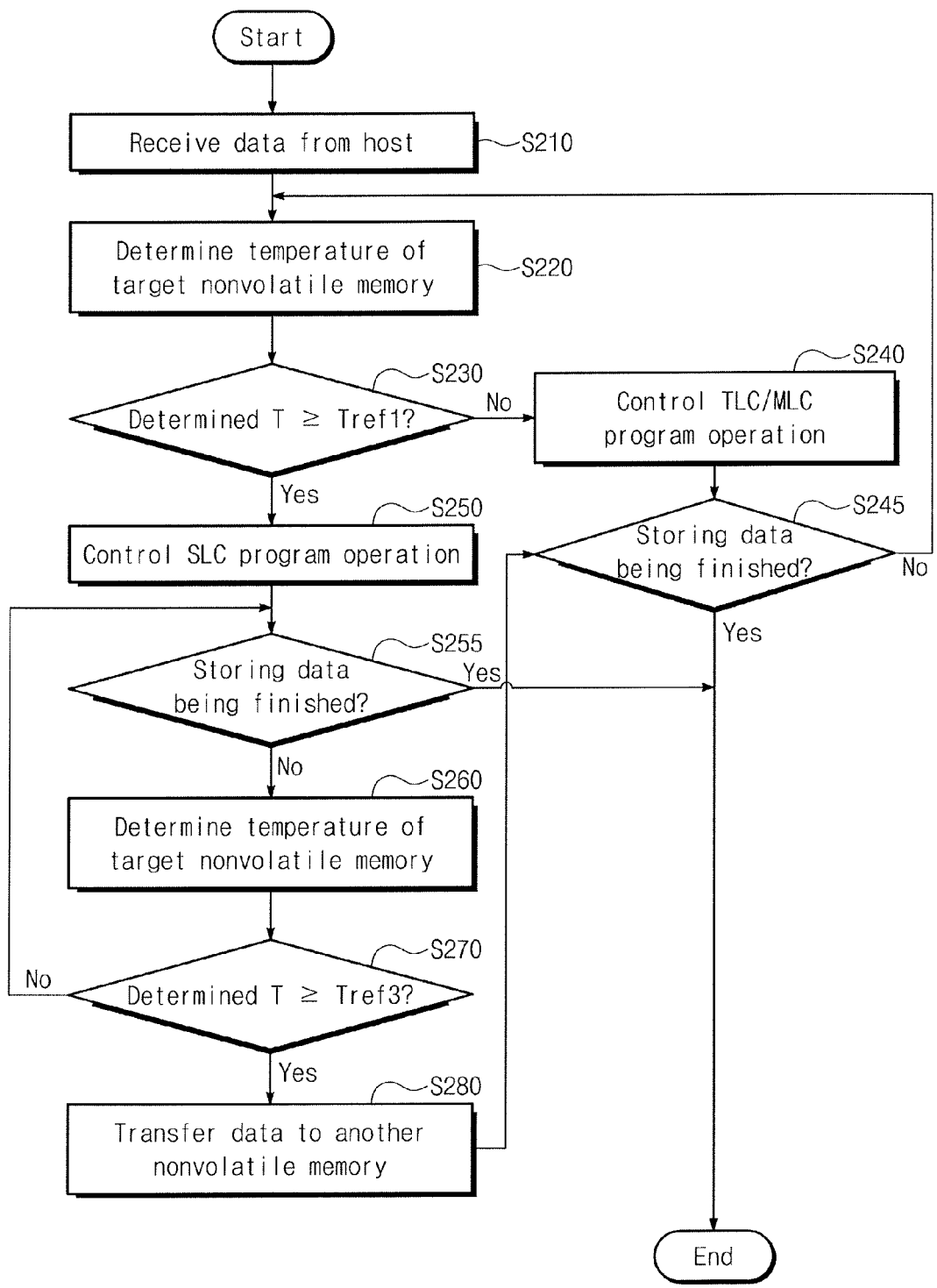
FIGS. 18 and 19 are flowcharts illustrating example operations of a storage device of FIG. 2.

FIG. 18 is a flowchart illustrating an example of an operation of a storage device of FIG. 2. To facilitate the explanation of the flowchart in FIG. 18, FIG. 2 will be referred to in conjunction with FIG. 18.

In operation S210, the memory controller 1330 may receive data from the host 1100. In operation S220, the memory controller 1330 may determine temperature of a target nonvolatile memory. In operation S230, the memory controller 1330 may compare the determined temperature of the target nonvolatile memory with a reference value Tref1. When the determined temperature of the target nonvolatile memory is lower than the reference value Tref1, operation S240 may be performed.

In operation S240, the memory controller 1330 may control the first program operation (e.g., a TLC or MLC program operation) such that data is stored in the target nonvolatile memory. In operation S245, the memory controller 1330 may determine whether storing data is finished. When storing data is not finished, the memory controller 1330 may successively determine the temperature of the target nonvolatile memory in operation S220 each time operation S220 is performed. On the other hand, when storing data is finished, the example operation of FIG. 18 may end.

When the temperature of the target nonvolatile memory is equal to or higher than the reference value Tref1, operation S250 may be performed. In operation S250, the memory controller 1330 may control the second program operation (e.g., a SLC program operation) such that data is stored in the target nonvolatile memory. In operation S255, the memory controller 1330 may determine whether storing data is finished. When storing data is finished, the example operation of FIG. 18 may end.

On the other hand when storing data is not finished, then in operation S260 the memory controller 1330 may determine the temperature of the target nonvolatile memory. In operation S270, the memory controller 1330 may compare the determined temperature of the target nonvolatile memory with a reference value Tref3. The reference value Tref3 may be greater than the reference value Tref1, and may indicate temperature of a case where the temperature of the target nonvolatile memory is excessively increasing.

When the determined temperature of the target nonvolatile memory is lower than the reference value Tref3, the memory controller 1330 may determine whether storing data is finished in operation S255. On the other hand, when at operation S255 the determined temperature of the target nonvolatile memory is equal to or higher than the reference value Tref3, the memory controller 1330 may transmit data to another nonvolatile memory, as described with reference to FIG. 13, in operation S280. Afterwards, the memory controller 1330 may determine whether storing data is finished in operation S245.

Figure 19:
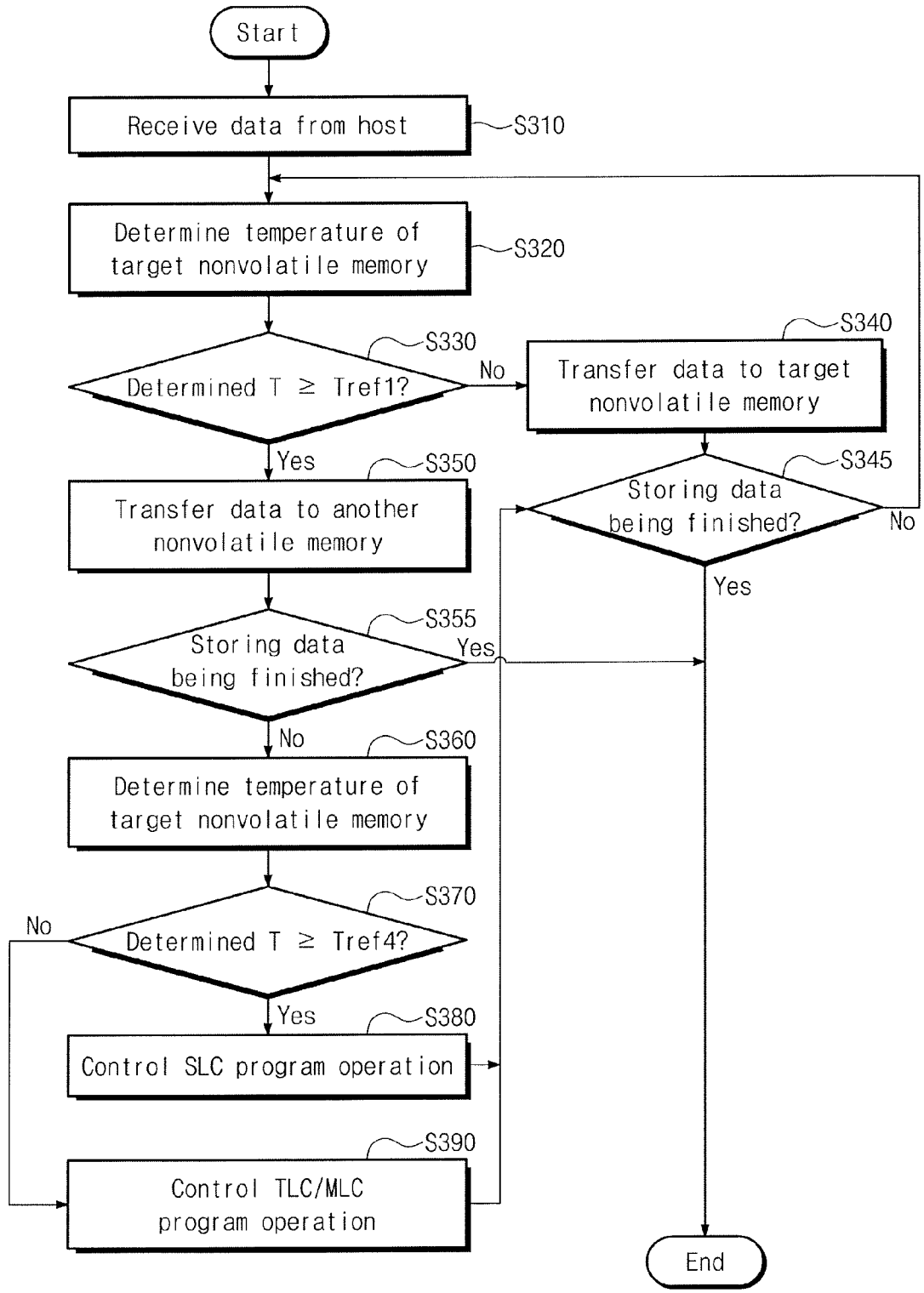

FIG. 19 is a flowchart illustrating an example of an operation of a storage device of FIG. 2. To facilitate better understanding, FIG. 2 will be referred to together with FIG. 19.

In operation S310, the memory controller 1330 may receive data from the host 1100. In operation S320, the memory controller 1330 may determine the temperature of a target nonvolatile memory. In operation S330, the memory controller 1330 may compare the determined temperature of the target nonvolatile memory with a reference value Tref1. When the determined temperature of the target nonvolatile memory is lower than the reference value Tref1, operation S340 may be performed.

In operation S340, the memory controller 1330 may transmit data to the target nonvolatile memory according to the first program operation. In operation S345, the memory controller 1330 may determine whether storing data is finished. When storing data is not finished, the memory controller 1330 may successively determine the temperature of the target nonvolatile memory in operation S320. On the other hand, when storing data is finished, the example operation of FIG. 19 may be end.

When the determined temperature of the target nonvolatile memory is to be equal to or higher than the reference value Tref1, operation S350 may be performed. In operation S350, the memory controller 1330 may transmit the data to other nonvolatile memory according to the second program operation. The other nonvolatile memory may be provided as a new target nonvolatile memory. In operation S355, the memory controller 1330 may determine whether storing data is finished. When storing data is finished, the example operation of FIG. 19 may be ended.

On the other hand, when storing data is not finished, the memory controller 1330 may determine the temperature of the (new) target nonvolatile memory in operation S360. In operation S370, the memory controller 1330 may compare the determined temperature of the target nonvolatile memory with a reference value Tref4. For example, the reference value Tref4 may indicate temperature of a case where the temperature of the target nonvolatile memory is increasing and attention is recommended.

When the determined temperature of the target nonvolatile memory is equal to or higher than the reference value Tref4, the memory controller 1330 may control the SLC program operation, described with reference to FIGS. 6 and 7, in operation S380. On the other hand, when the determined temperature of the target nonvolatile memory is lower than the reference value Tref4, the memory controller 1330 may control the TLC or MLC program operation, such as, for example, described with reference to FIGS. 6 and 7, in operation S390. Afterwards, the memory controller 1330 may determine whether storing data is finished in operation S345.

Figure 20:
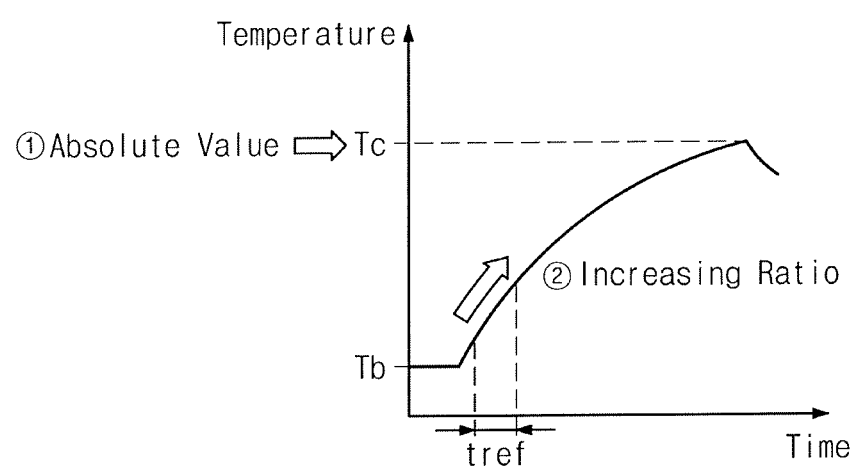
FIG. 20 is a graph illustrating examples associated with temperature which is managed by a storage device of FIG. 2.

FIG. 20 is a graph illustrating examples associated with temperature which is managed by a storage device of FIG. 2. To facilitate better understanding, FIG. 2 will be referred to together with FIG. 20.

In some example embodiments, the temperature of the nonvolatile memory described above may be associated with an absolute value of temperature. For example, the memory controller 1330 may control an operation of the nonvolatile memory such that an absolute value of the temperature of the nonvolatile memory does not exceed 'Tc'.

In some example embodiments, the temperature of the nonvolatile memory described above may be associated with a rate of increase on temperature per reference time "tref". For example, when a rate of increase on temperature of a target nonvolatile memory per the reference time tref is equal to or greater than a reference value, it is likely that the temperature of the target nonvolatile memory increases to 'Tc' in a short time. Thus, the rate of increase on the temperature of the nonvolatile memory per the reference time tref may be used as a suitable measure for managing the temperature of the nonvolatile memory. The reference time tref may be variously selected or changed taking into account various factors, such as thermal capacity of each of the nonvolatile memories 1311, 1312, and 1313, operation performance of the storage device 1300, a surrounding condition, and/or the like.

For example, when the rate of increase on the temperature of the target nonvolatile memory per the reference time tref is equal to or greater than the reference value, the memory controller 1330 may change the first program operation on the target nonvolatile memory to the second program operation, or may prepare changing an operation of the target nonvolatile memory. On the other hand, when the rate of increase on the temperature of the target nonvolatile memory per the reference time tref is smaller than the reference value, the memory controller 1330 may allow the temperature of the target nonvolatile memory to further increase.

In some example embodiments, the memory controller 1330 may consider both the absolute value of the temperature of the nonvolatile memory and the rate of increase on the temperature of the nonvolatile memory per the reference time tref. For example, when the rate of increase on the temperature of the target nonvolatile memory per the reference time tref is equal to or greater than the reference value, the memory controller 1330 may change the first program operation on the target nonvolatile memory to the second program operation. Nevertheless, when the absolute value of the temperature of the target nonvolatile memory reaches a dangerous level, the memory controller 1330 may decrease a bandwidth for the target nonvolatile memory or may operate other nonvolatile memory. The example embodiments may be variously changed or modified based on the aforementioned descriptions.

The above descriptions are to provide specific example embodiments for implementing the inventive concepts of the present disclosure. The present disclosure would include not only the example embodiments described above, but also other example embodiments obtained by simply changing or easily modifying the designs of the above-described example embodiments. The present disclosure would also include technologies which would be implemented in the future by simply changing or easily modifying the designs of the above-described example embodiments.

What is claimed is:

1. A storage device comprising:
   a nonvolatile memory; and a memory controller configured to:
  control a first program operation on the nonvolatile memory when a temperature of the nonvolatile memory is less than a first reference value, and
  control a second program operation on the nonvolatile memory when the temperature of the nonvolatile memory is equal to or greater than the first reference value, in which the first program operation and the second program operation are performed on data stored in the nonvolatile memory,
wherein the second program operation consumes less power than the first program operation,
wherein the memory controller is further configured to adjust an operational condition of the nonvolatile memory, such that bandwidth on the nonvolatile memory remains equivalent during the first and second program operations, and
wherein the second program operation includes a smaller number of voltage applying operations than the first program operation.

2. The storage device of claim 1, wherein:
the nonvolatile memory includes memory cells comprising multi-level cells or triple-level cells, and
the first program operation comprises a multi-level cell program operation or a triple-level cell program operation, and the second program operation comprises a single-level cell program operation.

3. The storage device of claim 1, wherein:
adjusting the operational condition of the nonvolatile memory comprises delaying data transmission to the nonvolatile memory and adjusting an operating frequency of the nonvolatile memory.

4. The storage device of claim 1, wherein:
the memory controller is further configured to manage information associated with whether data of the nonvolatile memory is stored according to the first program operation or the second program operation.

5. The storage device of claim 1, wherein:
the memory controller is further configured to limit a size of a memory area of the nonvolatile memory programmed according to the second program operation.

6. The storage device of claim 1, wherein:
when a wear level of a first memory area in the nonvolatile memory is lower than a wear level of a second memory area in the nonvolatile memory, the memory controller is further configured to control the nonvolatile memory to perform the second program operation on the first memory area.

7. The storage device of claim 1, wherein:
the memory controller is further configured to control the nonvolatile memory such that data stored in the nonvolatile memory according to the second program operation is rearranged according to the first program operation during an idle time period or a management time period.

8. The storage device of claim 1, wherein:
when the temperature of the nonvolatile memory is equal to or higher than a second reference value which is greater than the first reference value, the memory controller is further configured to control the nonvolatile memory such that the bandwidth on the nonvolatile memory decreases.

9. The storage device of claim 1, wherein:
the nonvolatile memory comprises a plurality of nonvolatile memories, and
when a first temperature of a first nonvolatile memory among the plurality of nonvolatile memories is equal to or higher than the first reference value and a second temperature of a second nonvolatile memory among the plurality of nonvolatile memories is lower than the first reference value, the memory controller is further configured to transmit data which is directed to the first nonvolatile memory to the second nonvolatile memory according to the second program operation.

10. A storage device comprising:
a plurality of nonvolatile memories; and
a memory controller configured to transmit first data and second data to the plurality of nonvolatile memories,
wherein, when a first temperature of a first nonvolatile memory among the plurality of nonvolatile memories is equal to or higher than a reference value and a second temperature of a second nonvolatile memory and a third temperature of a third nonvolatile memory from among the plurality of nonvolatile memories are each lower than the reference value, the memory controller is further configured to:
  transmit the first data which is directed to the first nonvolatile memory to the second nonvolatile memory, and
  transmit the second data which is directed to the third nonvolatile memory to the third nonvolatile memory, and
wherein the memory controller is further configured to transmit the first data to the second nonvolatile memory together with transmitting the second data to the third nonvolatile memory.

11. The storage device of claim 10, wherein:
the memory controller is further configured to control the plurality of nonvolatile memories such that data stored in the second nonvolatile memory migrates to a fourth nonvolatile memory among the plurality of nonvolatile memories prior to transmitting the first data to the second nonvolatile memory.

12. The storage device of claim 10, wherein:
when an average temperature of a fifth nonvolatile memory among the plurality of nonvolatile memories is higher than average temperature of a sixth nonvolatile memory among the plurality of nonvolatile memories during a reference time period, the memory controller is further configured to control the plurality of nonvolatile memories such that data stored in the fifth nonvolatile memory migrates to the sixth nonvolatile memory during an idle time period or a management time period.

13. The storage device of claim 10, wherein:
when a temperature of the second nonvolatile memory is changed to become equal to or higher than the reference value while the memory controller transmits the first data to the second nonvolatile memory, the memory controller is further configured to:
  change a first program operation on the second nonvolatile memory to a second program operation which accompanies a smaller number of voltage applying operations than the first program operation, or
  transmit a remaining part of the first data to a seventh nonvolatile memory having temperature which is lower than the reference value.

14. The storage device of claim 10, wherein the first temperature of the first nonvolatile memory, the second temperature of the second nonvolatile memory, and the third temperature the third nonvolatile memory are each associated with at least one of an absolute value of temperature or a rate of increase on temperature per reference time.

15. A storage device comprising:
a plurality of nonvolatile memories;
a memory controller configured to:
  control read and write operations on data stored in the nonvolatile memories, and
  control at least a first program operation and a second program operation; and
at least one temperature sensor being arranged substantially adjacent at least one nonvolatile memory of the plurality of nonvolatile memories, the at least one temperature sensor having an output connected to the memory controller to provide temperature information to the memory controller,
wherein the memory controller determines a temperature of the at least one nonvolatile memory, and controls execution of the first program operation when the determined temperature of the at least one nonvolatile memory is less than a first reference value,
wherein the memory controller controls execution of the second program operation when the determined temperature of the at least one nonvolatile memory is equal to or greater than the first reference value, and
wherein the memory controller decreases a bandwidth of the at least one nonvolatile memory when the determined temperature of the at least one nonvolatile memory is equal to or greater than a second reference value that is greater than the first reference value.

16. The storage device according to claim 15, wherein subsequent to the bandwidth of the at least one nonvolatile memory being decreased, the memory controller restores the bandwidth of the at least one nonvolatile memory upon a determination that the determined temperature of the at least one nonvolatile memory has decreased to a temperature at least less than the second reference value.

17. The storage device according to claim 15, wherein the at least one temperature sensor comprises a plurality of temperature sensors in which each one temperature sensor is arranged substantially adjacent a respective nonvolatile memory of the plurality of nonvolatile memories.

18. The storage device according to claim 15, wherein the memory controller further includes a delay buffer to delay data transmission to the at least one nonvolatile memory.

19. The storage device according to claim 18, wherein the memory controller is further configured to tune an operational condition of the at least one nonvolatile memory during a transition from the first program operation to the second program operation by transmitting data to the delay buffer.

20. The storage device according to claim 15, wherein the memory controller is further configured to tune an operational condition of the at least one nonvolatile memory during a transition from the first program operation to the second program operation by controlling a decrease in an operating frequency of the at least one nonvolatile memory.

* * * * *